(12) United States Patent
Davis et al.

(10) Patent No.: US 9,535,097 B2
(45) Date of Patent: Jan. 3, 2017

(54) ELECTRO-OPTIC CURRENT SENSOR WITH HIGH DYNAMIC RANGE AND ACCURACY

(71) Applicant: Gridview Optical Solutions, LLC, Plano, TX (US)

(72) Inventors: Philip B. Davis, Richardson, TX (US); Ye Li, Plano, TX (US); Theodore C. Konetski, Azle, TX (US)

(73) Assignee: GRIDVIEW OPTICAL SOLUTIONS, LLC., Plano, TX (US)

(*) Notice: Subject to any disclaimer, the term of this patent is extended or adjusted under 35 U.S.C. 154(b) by 117 days.

(21) Appl. No.: 14/278,848

(22) Filed: May 15, 2014

(65) Prior Publication Data

US 2014/0300341 A1    Oct. 9, 2014

Related U.S. Application Data

(63) Continuation-in-part of application No. 13/553,486, filed on Jul. 19, 2012, now Pat. No. 9,134,344.
(Continued)

(51) Int. Cl.
*G01R 13/38* (2006.01)
*G01R 15/14* (2006.01)
(Continued)

(52) U.S. Cl.
CPC ............ *G01R 15/142* (2013.01); *G01R 1/071* (2013.01); *G01R 15/246* (2013.01); *G01R 15/247* (2013.01)

(58) Field of Classification Search
CPC ..... G01R 15/247; G01R 15/246; G01R 1/071; G01R 33/091; G01D 15/00; G01D 5/344
See application file for complete search history.

(56) References Cited

U.S. PATENT DOCUMENTS 2,295,959 A  9/1942  Melville
2,709,800 A  5/1955  Temple et al.
(Continued)

FOREIGN PATENT DOCUMENTS

CN   101430347 A   5/2009
EP   0736772 A2   10/1996
(Continued)

OTHER PUBLICATIONS

Siobodan Petricevic, Slatan Stojkovic and Jovan B. Radunovic; Title: Practical Application of Fiber-Optic Current Sensor inPower System Harmonic Measurement, vol. 55, No. 3, Jun. 2006 www.fieldmetrics.net.
(Continued)

*Primary Examiner* — Tung X Nguyen
(74) *Attorney, Agent, or Firm* — Steptoe & Johnson LLP

(57) ABSTRACT

An optical sensor that senses current by directing polarized light across an airgap that is orthogonal to a direction of current running through a conductor. The sensor includes a prism having a high Verdet constant for high sensitivity to magnetic fields, which cause an angle of polarization of the polarized light to be rotated as an indication of the magnitude of current. A polarizing beamsplitter having a low Verdet constant is mounted to the prism so that incoming light that is traveling in a direction orthogonal to the magnetic field being sensed across the airgap is insensitive to unwanted magnetic fields produced by nearby conductors. The distance the light travels in this orthogonal direction is minimized, reducing the overall volume of the sensor, making a compact sensor highly sensitive to magnetic fields of interest, largely insensitive to unwanted magnetic fields, and having a very high dynamic range for sensing current.

19 Claims, 21 Drawing Sheets

Related U.S. Application Data

(60) Provisional application No. 61/823,849, filed on May 15, 2013.

(51) Int. Cl.
  *G01R 1/07* (2006.01)
  *G01R 15/24* (2006.01)

(56) References Cited

U.S. PATENT DOCUMENTS

| | | |
|---|---|---|
| 3,324,393 A | 6/1967 | Edward et al. |
| 3,386,032 A | 5/1968 | Medlar |
| 4,216,503 A | 8/1980 | Wiggins |
| 4,564,754 A | 1/1986 | Sato et al. |
| 4,590,505 A | 5/1986 | Bluzer |
| 4,635,055 A | 1/1987 | Fernandes et al. |
| 4,683,421 A | 7/1987 | Miller et al. |
| 4,755,665 A | 7/1988 | Ulmer, Jr. et al. |
| 4,758,962 A | 7/1988 | Fernandes et al. |
| 4,797,607 A | 1/1989 | Dupraz |
| 4,799,005 A | 1/1989 | Fernandes et al. |
| 4,829,298 A | 5/1989 | Fernandes |
| 4,869,254 A | 9/1989 | Stone |
| 4,894,608 A | 1/1990 | Ulmer |
| 4,947,107 A | 8/1990 | Doerfler et al. |
| 4,962,990 A | 10/1990 | Matsuzawa et al. |
| 4,999,571 A | 3/1991 | Ishiko et al. |
| 5,029,101 A | 7/1991 | Fernandes et al. |
| 5,114,228 A | 5/1992 | Greenfield et al. |
| 5,130,642 A | 7/1992 | Hoffman et al. |
| 5,311,138 A | 5/1994 | Ott et al. |
| 5,382,901 A | 1/1995 | Okajima et al. |
| 5,451,864 A * | 9/1995 | Nakamoto .......... G01R 33/0322 324/117 R |
| 5,486,754 A | 1/1996 | Cruden et al. |
| 5,731,579 A | 3/1998 | Woods |
| 5,732,167 A | 3/1998 | Ishiko et al. |
| 5,878,176 A | 3/1999 | Cheng |
| 5,892,357 A | 4/1999 | Woods et al. |
| 5,939,711 A | 8/1999 | Crawford et al. |
| 5,952,819 A | 9/1999 | Berkcan et al. |
| 5,963,026 A | 10/1999 | Bosselmann et al. |
| 6,072,366 A | 6/2000 | Maeda et al. |
| 6,124,706 A | 9/2000 | Woods et al. |
| 6,166,816 A | 12/2000 | Blake |
| 6,297,625 B1 | 10/2001 | Bosselmann et al. |
| 6,307,666 B1 | 10/2001 | Davidson et al. |
| 6,362,615 B1 | 3/2002 | Davidson et al. |
| 6,388,434 B1 | 5/2002 | Davidson et al. |
| 6,462,327 B1 | 10/2002 | Ezell |
| 6,512,357 B2 | 1/2003 | Bosselmann et al. |
| 6,580,553 B2 | 6/2003 | Kim et al. |
| 6,630,819 B2 | 10/2003 | Lanagan et al. |
| 6,753,913 B1 | 6/2004 | Bilhan |
| 6,844,799 B2 | 1/2005 | Attarian et al. |
| 7,068,025 B2 | 6/2006 | Bjorn |
| 7,129,693 B2 | 10/2006 | Yakymyshyn et al. |
| 7,164,263 B2 | 1/2007 | Yakymyshyn et al. |
| 7,199,571 B2 | 4/2007 | Johnson et al. |
| 7,646,192 B2 | 1/2010 | Bjorn |
| 7,683,795 B2 | 3/2010 | Bjorn |
| 7,777,605 B2 | 8/2010 | Zumoto et al. |
| 7,786,719 B2 | 8/2010 | Kurosawa et al. |
| 7,837,807 B2 | 11/2010 | Yoshizawa |
| 2004/0223678 A1 | 11/2004 | He et al. |
| 2005/0083033 A1 * | 4/2005 | Kurosawa ............ G01R 15/246 324/96 |
| 2006/0170410 A1 | 8/2006 | Bjorn |
| 2007/0205750 A1 | 9/2007 | Yakymyshyn et al. |
| 2011/0052115 A1 | 3/2011 | Lee |

FOREIGN PATENT DOCUMENTS

| | | |
|---|---|---|
| JP | 61-070468 | 4/1986 |
| JP | 04-194668 | 7/1992 |
| JP | 05-72233 | 3/1993 |
| JP | 7333258 A | 12/1995 |
| JP | 08-5462 | 1/1996 |
| JP | 2000-21664 | 1/2000 |
| JP | 2007-104832 | 4/2007 |
| JP | 2007-285765 | 11/2007 |
| WO | WO 2011/053657 A1 | 5/2011 |

OTHER PUBLICATIONS

Siobodan Petricevic, Slatan Stojkovic and Jovan B. Radunovic; Title: Development of a Portable Fiber-Optic Current Sensor for Power Systems Monitoring; Publication: IEEE Transactions on Instrumentation and Measurement, vol. 53 No. I, Feb. 2004.

PCT/US2010/054333 International Search Report and Written Opinion dated Dec. 30, 2010.

PCT/US2013/021733 International Search Report and Written Opinion dated Apr. 18, 2013.

Shuping Wang, Avinash Karri, Yossi Harlev; Use of dual-frequency excitation method to improve the accuracy of an optical current sensor; Published about Aug. 21, 2009, Library of Congress.

Dr Chris Yakymyshyn, Assoc. Prof. Department Electr. and Computer Engineering, Montana State University, Bozeman Montana; Tutorial on Optical Current Sensor Systems, Proceedings 3rd EPRI Optical Sensor Systems Workshop, Feb. 2002.

Guenter B. Finke, Gapped Magnetic Core Structures, Magnetic Metals Corporation, Camden, New Jersey 08101. Obtained from Internet, searching for Finke, Gapped Magnetic Core Structure.

IEC International Standard 60044-8 Ed. First edition, Jul. 2002, Title page, 'Instrument transformers, Part 8: Electronic current transformers and pp. 118-122, describing' Requirements on ECTs, [Electronic Current Transformers], and eVTs, [Electronic Voltage Transformers], involving digital data transmission or processing.

* cited by examiner

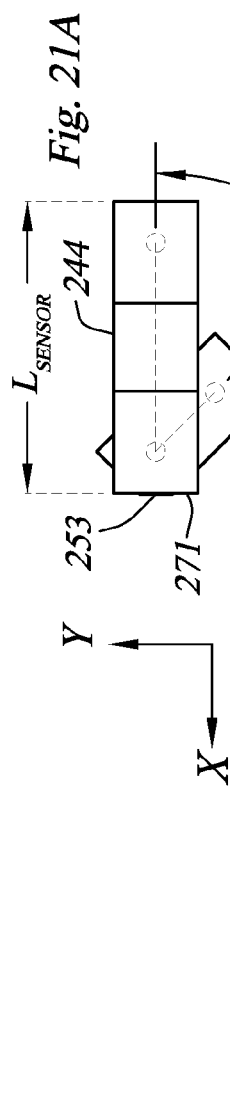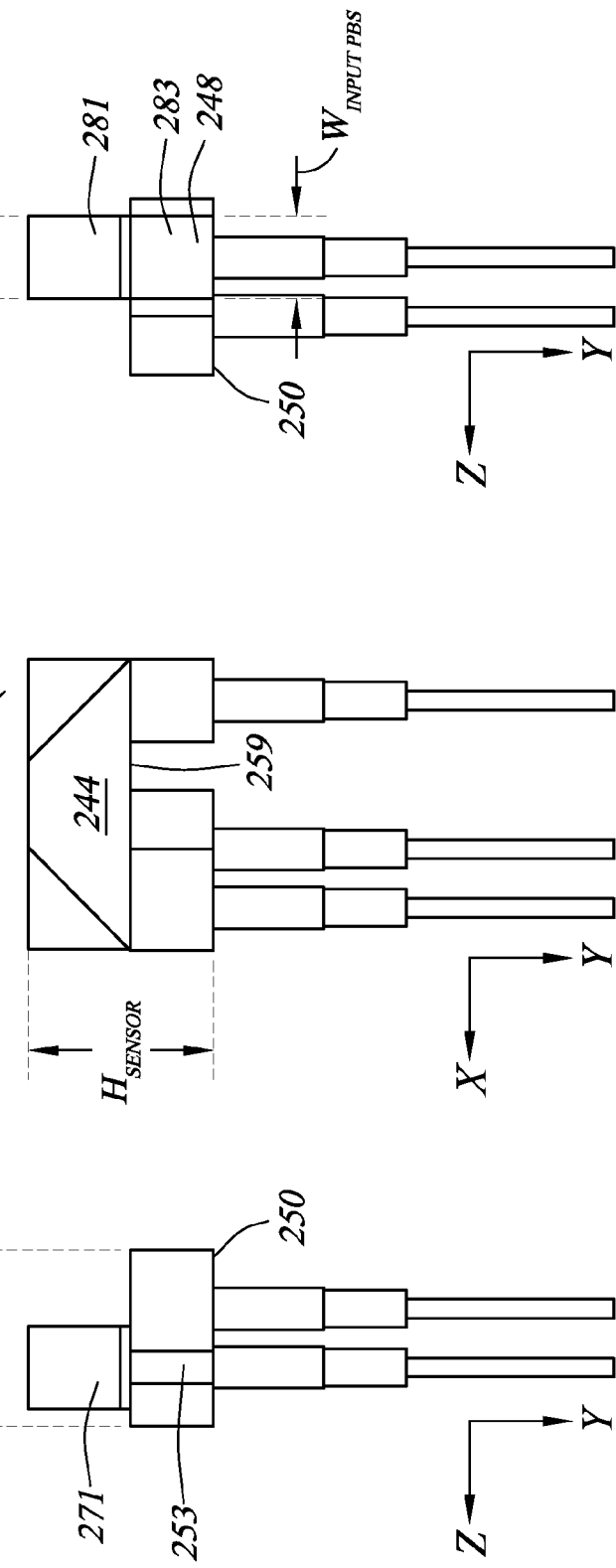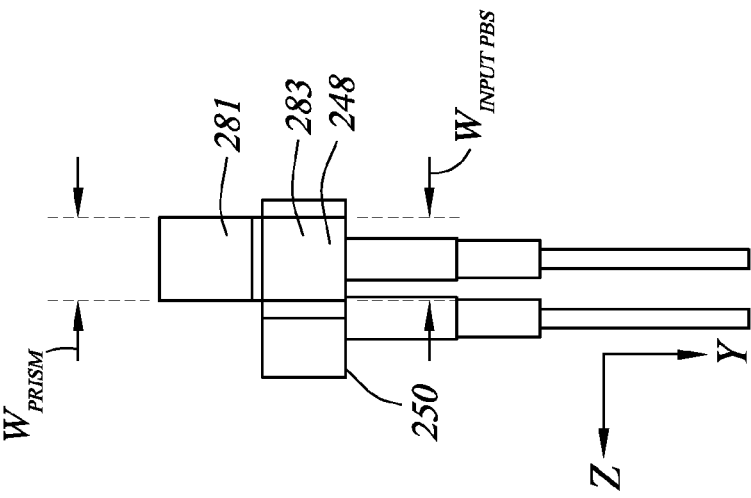

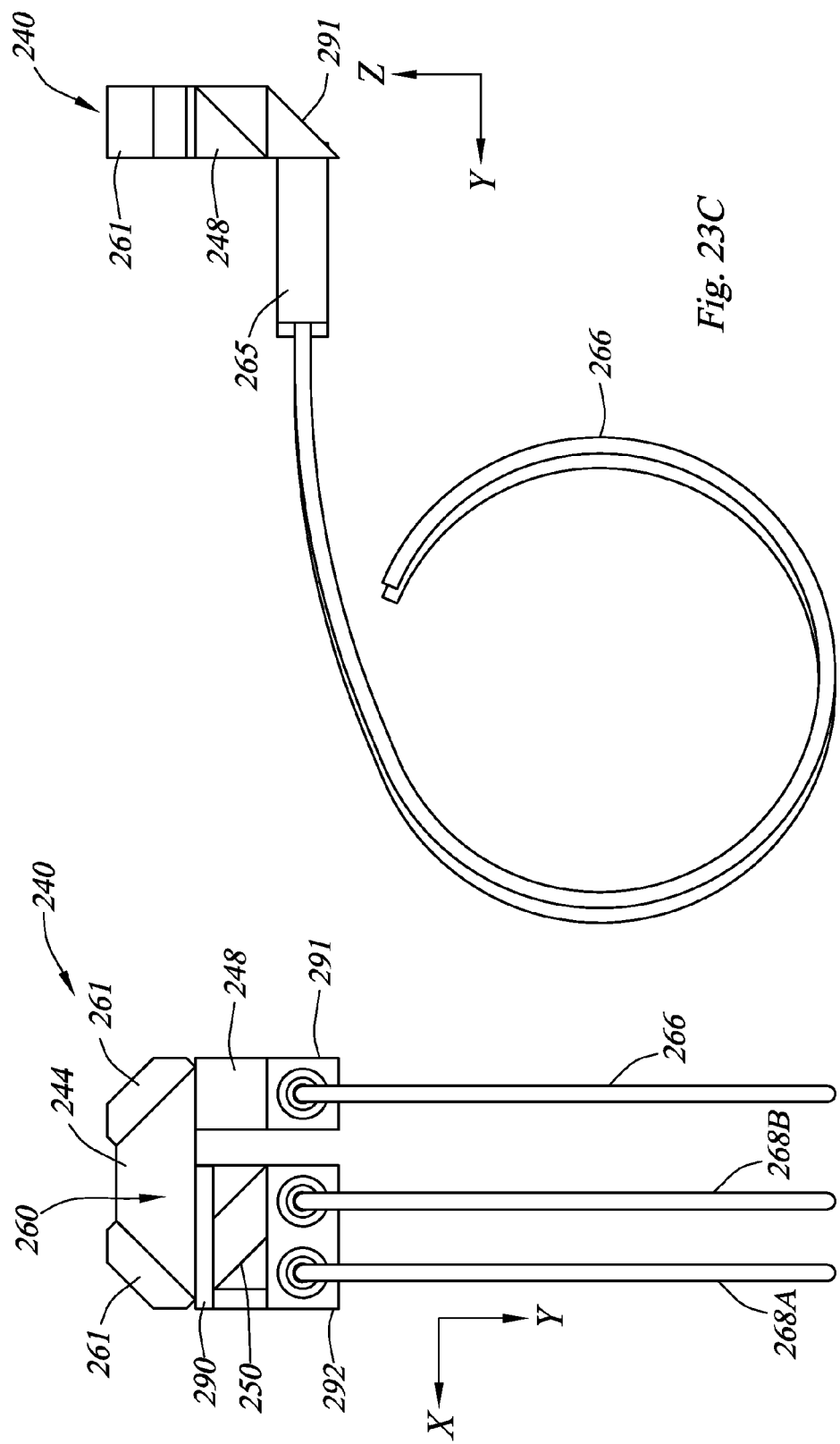

ELECTRO-OPTIC CURRENT SENSOR WITH HIGH DYNAMIC RANGE AND ACCURACY

CROSS-REFERENCE TO RELATED APPLICATIONS

This application claims the benefit of U.S. Provisional Patent Application Ser. No. 61/823,849, filed May 15, 2013, entitled, "Electro-Optic Current Sensor With High Dynamic Range and Accuracy," and is a continuation-in-part of U.S. patent application Ser. No. 13/553,486, filed Jul. 19, 2012, entitled "Optical Sensor Assembly For Installation on a Current Carrying Cable," both of which are hereby incorporated by reference herein in their entireties.

FIELD OF THE PRESENT DISCLOSURE

Aspects of the present disclosure relate to optical sensors, and more particularly, to optical sensors used to sense an electrical current in a current carrying cable.

BACKGROUND

A variety of sensors have been developed for measuring current in a current carrying cable, such as current in a high voltage electrical distribution system. Optical current sensors 30 based on the birefringence of various materials, and the Faraday effect, from the magnetic field, and optical voltage sensors based on the Pockels effect, from the voltage field, are known in the art. Optical current sensors, that use fiber optic cable that surround the current carrying cable, although they may have a suitable dynamic range, require opening the current carrying cable at installation. Hence they are expensive and cumbersome to install.

Optical current sensors utilizing a magnetic concentrator with bulk optical sensors, (as opposed to fiber optics), in an airgap are also known in the art. One such embodiment is discussed in an article titled "Use of Dual Frequency Excitation Method to Improve the Accuracy of an Optical Current Sensor," by Shuping Wang, et al, SPIE meeting, August, 2009.

Airgaps within powder core magnetic material stabilize the temperature sensitivity of the magnetic material. Such stabilization, with respect to laminated magnetic core structures, is discussed in the publication "Gapped Magnetic Core Structures," by Guenter B. Finke, Magnetic Metals Corporation, Camden, N.J. 08101.

Blake, U.S. Pat. No. 6,166,816, describes the use of one light source for a combined fiber optic current and voltage sensor. It is, however, difficult to make use of the current sensor disclosed. The electric utility company can use it during a new set up or take apart the current carrying cable for installation.

Ishiko et al., U.S. Pat. No. 4,999,571, describes a clamp-on optical current and voltage sensor. The sensor must be attached to the line when the voltage to the line is off. The crystal used in the current sensor is a garnet crystal, which is temperature sensitive. The sensor also uses a quarter-wave plate in connection with the voltage sensor and such quarter-wave plate is also temperature sensitive. In Ishiko, the current carrying cable is not firmly held by the device until the U-shaped, magnetic core is in its closed position.

Bjorn, U.S. Pat. No. 7,068,025, teaches a simplified sensor, a small glass rod lying on the current carrying cable. Based on the Faraday effect, rotation of the plane of polarization of polarized light in the glass rod is proportional to the intensity of the magnetic field surrounding the cable. The strength of the magnetic field surrounding the conductor is in accordance with the level of electric current passing through the conductor. The Bjorn patent teaches a method in which the sensor samples only one locality and only for a short distance along the conductor.

C. V Temple et al., U.S. Pat. No. 2,709,800, teaches a power line fault detector that allows mechanical adjustment of the airgap of a concentrator and inductive coupling for detecting various levels of current. This sensor may only be used for the detection of fault currents.

Bosselmann et al., U.S. Pat. No. 5,963,026, discloses two Faraday elements or crystals for two 5 different measurement ranges of current in order to achieve a higher dynamic range. This adds to the complexity and the cost.

The prior art teaches various devices and methods for measuring the current in real time in a current carrying cable using optical sensors. However, the prior art does not teach an economical, simple sensor assembly design for accurate measurements across a large dynamic range, sensitivity and bandwidth, that is capable of being installed on the cable without disturbing the operating function of the cable. The present disclosure fulfills these and other needs and provides further related advantages as described in the following summary.

A need also exists for a small, compact current sensor that is highly sensitive to a magnetic field of interest but highly insensitive to unwanted magnetic fields, such as from nearby current carrying cables.

BRIEF SUMMARY

An aspect of the present disclosure relates to an optical sensor assembly for installation on an electrical current carrying cable and sensing much information about the current in the cable, and, further, embodiments of an optical sensor assembly combined with an electronics systems, (preferably, located a distance away from the cable), and capable of one or more of sensing, measuring, indicating, analyzing and evaluating the current in the cable.

According to an aspect, the present disclosure provides an optical sensor assembly for sensing current in a current carrying cable by a magnetic concentrator creating a magnetic field, from said cable, representing current in the cable, and optical sensing of the magnetic field of the cable to provide electrical signals representing the sensed current. By combining such optical sensor assembly with an electronics system having a computing device, data processing system or the like, such electrical signals may then be analyzed and evaluated to provide a wide range of information concerning an electrical power distribution system.

It is understood that the "current" in a power distribution cable, (and even in other current carrying wires or cables), may well be comprised of a plurality of components having a myriad of amplitudes and frequencies, as well as direct currents, (DC). As used herein, "current" is intended to comprehend a "single current" (that is, a current of singular amplitude and singular frequency and, also, DC current), and, as well, "a current having a plurality of component current frequencies or amplitudes, or both, as well as, DC."

An objective is to provide an optical sensor assembly for installation on a current carrying cable without having to disrupt the function of the cable.

Still another objective, in an aspect of this disclosure, is to provide an optical sensor assembly in combination with an electronics system, having a wide dynamic range and sensitivity of measurement that can perform one or more of many features, such as, but not limited to, identification, measurement, display and indication, analysis, evaluation and reporting of information, indicative of the characteristics of current flowing in a cable.

A further aspect of the present disclosure relates to an electro-optic current sensor with a polarizing beam splitter having a low Verdet constant. The sensor material has a high Verdet constant and is positioned very close to the polarizing beam splitter. The material composition and spatial arrangement of the PBS relative to the sensor material operate to reduce effects of extraneous electromagnetic interference from adjacent conductors that produce interfering electromagnetic fields. Instead of a polarizing beam splitter, a zero-order waveplate can be used to polarize the light along a linear direction, allowing the overall size of the current sensor to be reduced to a very compact size.

Other features and advantages of the present disclosure will become apparent from the following more detailed description, taken in conjunction with the accompanying drawings, which illustrate, by way of example, the principles of the disclosure.

BRIEF DESCRIPTION OF THE DRAWINGS

FIG. 9, includes a device such as a computing device, a digital signal processor or a microprocessor or the like;

FIGS. 21A-21D illustrate top, side, and end views of an optical sensor assembly based on the one shown in FIGS. 19 and 20.

FIGS. 23A-23C illustrates perspective, side, and end views, respectively, of an optical sensor assembly having a prism mirror mounted to the light output surface of the output polarizing beamsplitter to direct the output light in a direction along the y-axis when the optical sensor assembly is inserted into the airgap as shown in FIG. 18.

DETAILED DESCRIPTION

Figure 1:
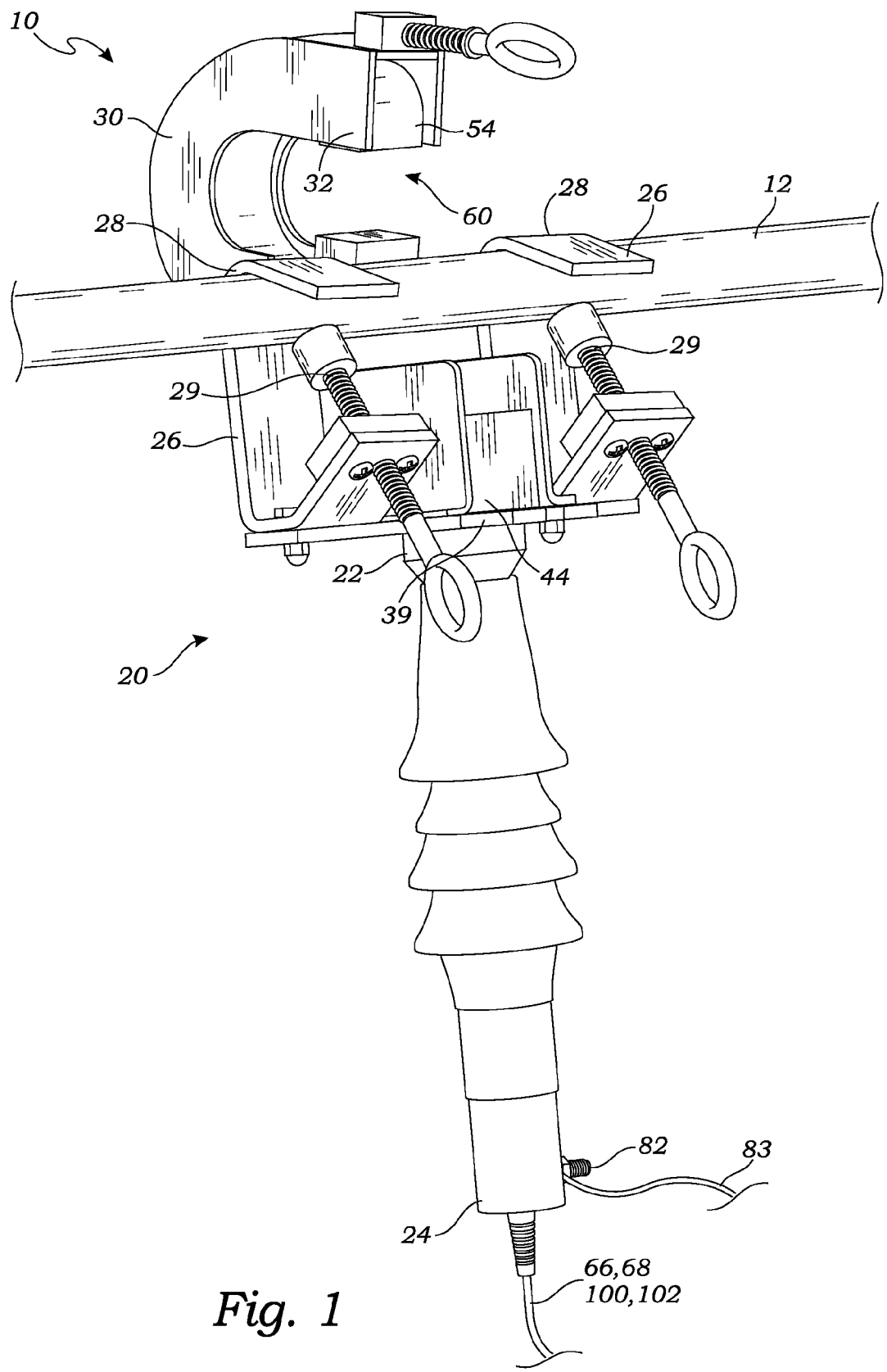
FIG. 1 is a perspective view of an optical sensor assembly when a magnetic concentrator is in open position, according to one embodiment of the present disclosure.

FIG. 1 is a perspective view of one embodiment of the optical sensor assembly 10 wherein the magnetic concentrator 54 is in the open position and has not yet been placed in a position to encompass or partially encompass the current carrying cable. It is noted, nevertheless, that in this position, the current carrying cable 12 is firmly held by the optical sensor assembly 10.

Figure 2:
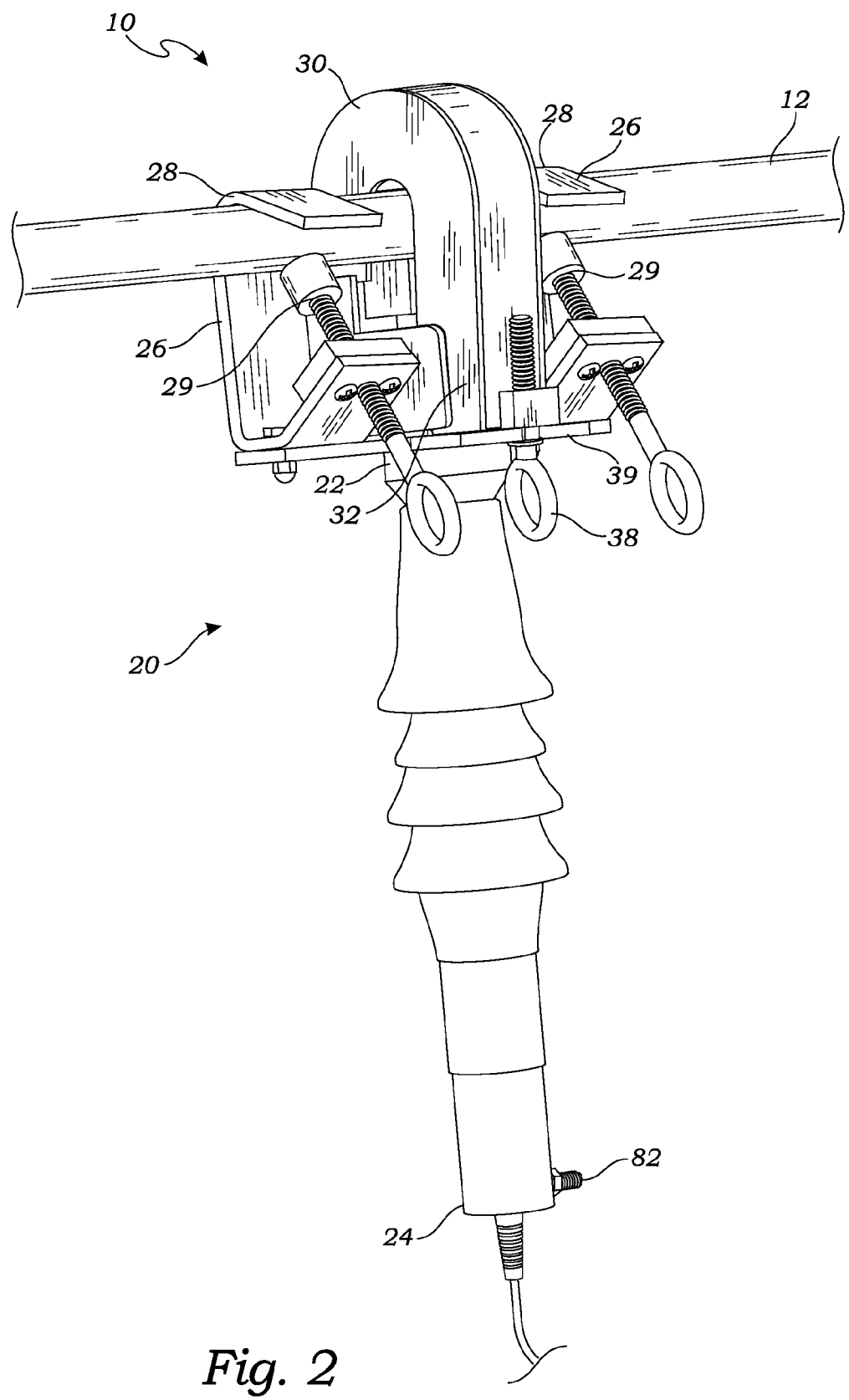
FIG. 2 is a perspective front view of FIG. 1 showing the magnetic concentrator is in a closed position.

FIG. 2 is a perspective front view of FIG. 1, showing the magnetic concentrator in closed position showing housing 30 locked in place by locking element 38.

Figures 5A, 5B, 6:
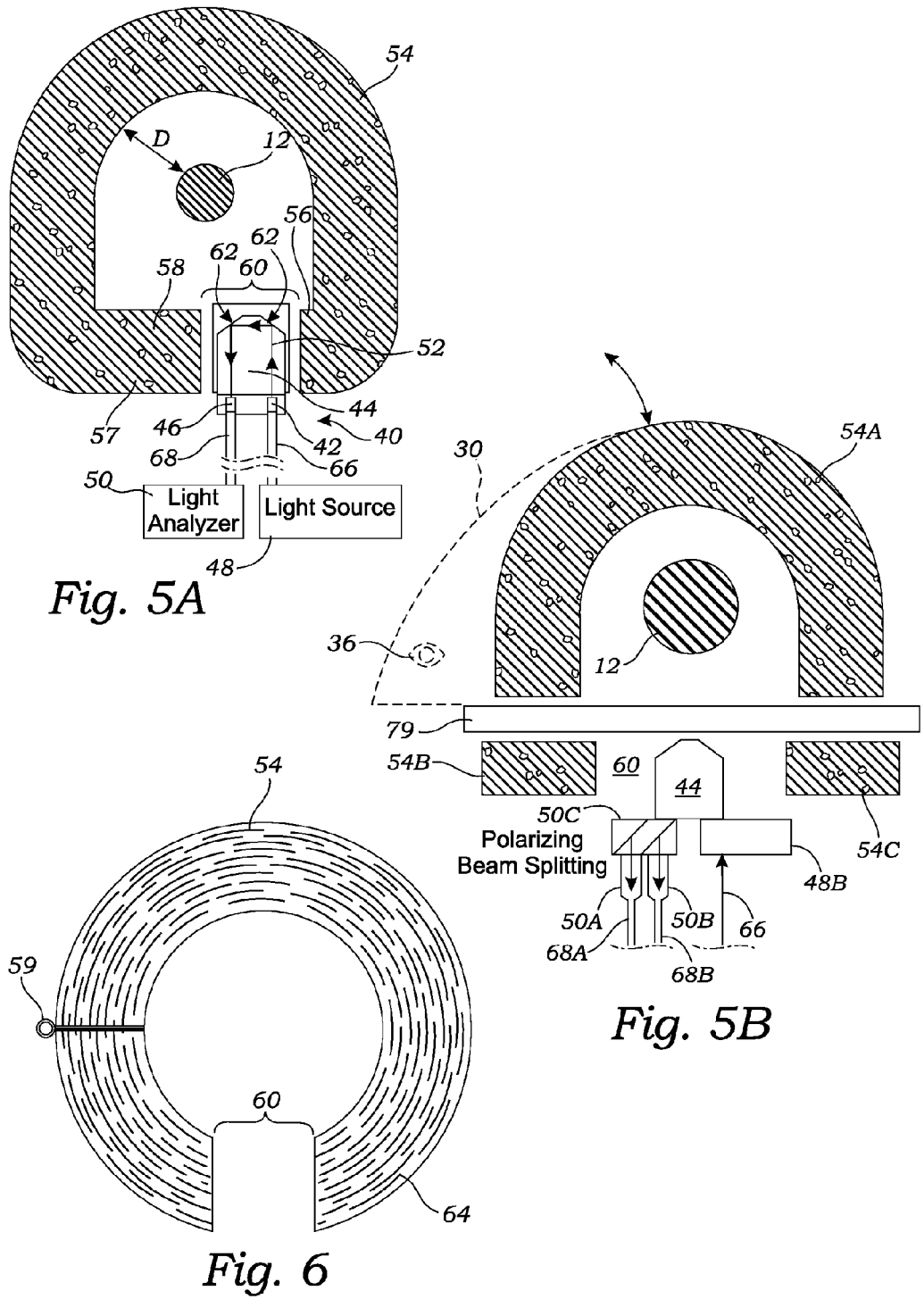
FIG. 5A is a side elevation, cross-section view of a powder core magnetic concentrator, closed, as in FIGS. 2 and 4, in relation to the cable and the current sensor. The magnetic concentrator further illustrates the airgap in the magnetic concentrator, according to one embodiment of the disclosure.
FIG. 5B is a side elevation, illustrating an alternative magnetic core construction, in cross-section, and an alternative location of the airgap and an optical current sensor within the airgap. Also shown are the input to and outputs from the optical current sensor.
FIG. 6 is a side elevation, cross-section view of a hinged, laminated magnetic concentrator illustrating an airgap in the magnetic concentrator and having laminations of strips of magnetic material adhered together adhesively and/or in a medium of non-magnetic 30 material, in some embodiments of the disclosure.

Referring to FIGS. 1 and 2, the base unit 20, which extends from hooks 26 to the bottom of the optical sensor assembly 10, uses two hooks 26, as shown, for hanging the base unit 20 from the current carrying cable 12. Only one hook, by itself, or, possibly, with additional ties, strapping or other structure may be used. In the embodiment of FIG. 1, a pair of hooks 26, one on either side of a light directing device 44, (which in one embodiment, is shown in FIG. 5B, as being a reflective prism 44, of the optical current sensor 40), as discussed in greater detail below. Each of the hooks 26 may include a curved portion 28 adapted to firmly hold the base unit 20 to the current carrying cable 12.

As illustrated in FIGS. 1-4, each hook 26 may further include a clamp 29, such as a screw clamp as illustrated, although other clamps and equivalent fasteners may be used. The words "clamp" and "clamps" are intended to include such alternative constructions which will firmly hold the current carrying cable in fixed position relative to base unit 20 at least when the housing is closed. The illustrated clamp 29, forces the current carrying cable 12 against the curved portion 28 of the hook 26 to secure the base unit 20 to the current carrying cable 12, so that the assembly remains physically stable relative to the cable even in rough weather conditions.

In attaching the optical sensor assembly 10 to a current carrying cable 12, what is needed is "means for holding the cable firmly," whether the magnetic concentrator 54 is open or closed. It is to be understood that the cable 12 may be held in a fixed position relative to the body of the optical sensor assembly 10, as shown, or, alternatively, with the clamps 29 held in a fixed position with respect to the movable magnetic concentrator 54. In closed, operating position, the magnetic concentrator 54 must encircle the cable 12 or a sufficient amount thereof so as to pick up the magnetic field of cable 12 and extend the magnetic field to the magnetic concentrator's airgap 60 in which the optical current sensor 40 is disposed when in operating position. Refer to FIGS. 5A and 5B for illustration of airgap 60 and optical current sensor 40. Further, the magnetic field provided by the magnetic concentrator 54 must be strong enough to exclude stray, undesired magnetic fields, or else, suitable means against them must be provided.

Among the alternatives to hooks, clamps, fasteners and the like, for holding the current-carrying cable, it is to be appreciated that plastic ties, wires, ropes, chains, and all sorts of means may be devised for firmly holding the current-carrying cable with respect to the optical sensor assembly. "Clamps" is intended to cover all sorts of hooks, fasteners, jaws, wedges, vices and other devices adapted or adaptable to the firmly holding of the cable 12.

A concentrator housing 30 is pivotally attached at the top of the optical sensor assembly 10 and partially encloses the magnetic concentrator 54 and, when in operation, holds it around the current carrying cable 12. The concentrator housing 30 has a first end 32 and a second end 34, illustrated in FIGS. 3 and 4. By also referring to FIGS. 3 and 4, it can be seen that a pivot 36 of the second end 34 of the concentrator housing 30 pivotally attaches the concentrator housing 30 such that the concentrator housing 30 moves both itself and the magnetic concentrator 54 between an open position and a closed position. Other constructions may be readily designed to properly position the magnetic concentrator 54 around the current carrying cable 12, at least during operation of the optical sensor assembly 10.

The structure holding the cable 12, magnetic concentrator 54, and other elements of the optical sensor assembly 10, is rigidly designed to minimize vibrations that cause erratic readings in the system. It is to be appreciated that, in operation, the cable 12 is fixedly held, either with respect to the body of the optical sensor assembly 10, or fixed with respect to the magnetic concentrator 54, whether the magnetic concentrator 54 is open or closed. The preferred embodiment is wherein the cable 12 is fixedly held with respect to the body of the optical sensor assembly 10, rather than to the magnetic concentrator 54.

Figure 3:
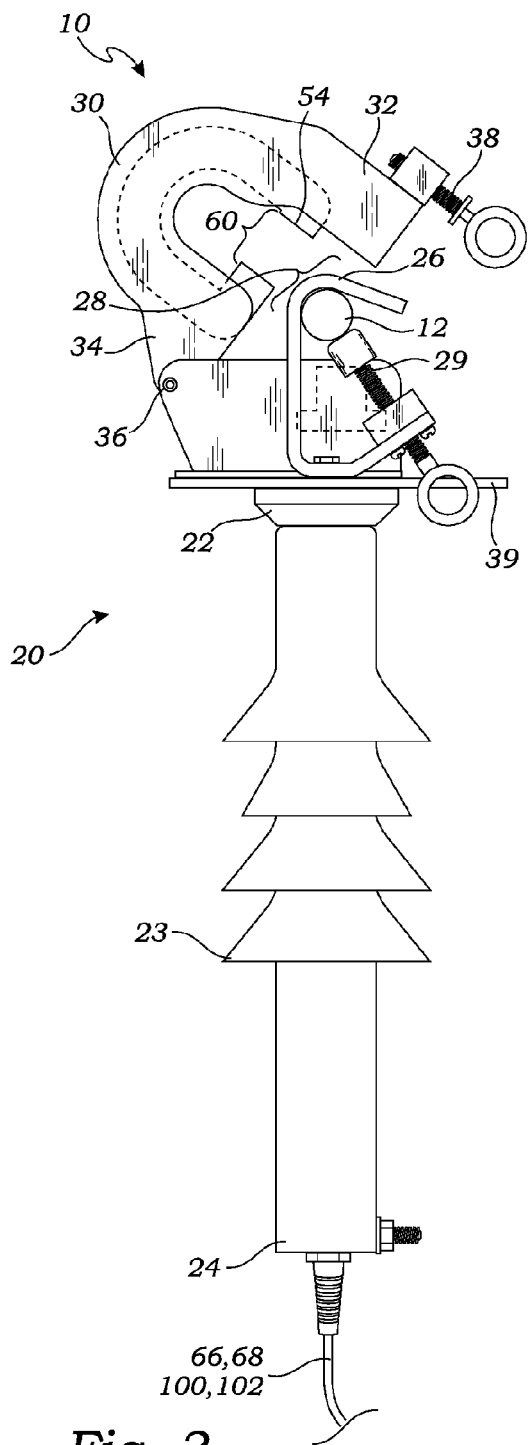
FIG. 3 is a side elevation view of FIG. 1 showing the magnetic concentrator in the open position.
Figure 4:
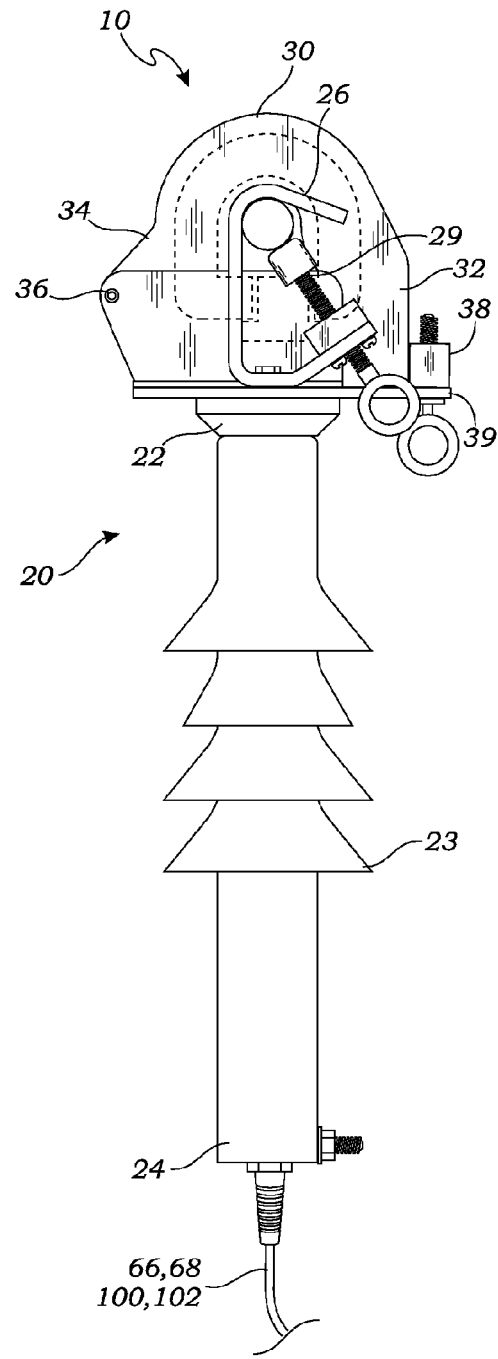
FIG. 4 is a side elevation view of FIG. 2, showing the magnetic concentrator in the closed position.

FIGS. 3 and 4 are side elevations of the optical sensor assembly 10.

Referring to FIGS. 3 and 4, it may be seen that in the open position, FIG. 3, the concentrator housing 30 is moved away from the base unit 20. In FIG. 4, the closed position, the concentrator housing 30 positions the magnetic concentrator 54 around the current carrying cable 12 such that the current carrying cable 12 passes through the airgap 60 to the interior of the magnetic concentrator 54 without physically touching the magnetic concentrator 54 or the concentrator housing 30.

It is to be understood that other constructions may be devised wherein the cable 12 need not pass through the airgap 60.

A locking element 38 is provided for removably securing the first end 32 of the concentrator housing 30 to the base unit 20 in the closed position. In the present embodiment, the locking element 38 is a screw-type clamp attached to the concentrator housing 30 that removably engages a flange 39 of the base unit 20. The locking element 38 locks the concentrator housing 30 in the closed position, thereby maintaining the magnetic concentrator 54 in its position which creates a magnetic field around optical current sensor 40 (not shown) which lies within, or in some embodiments, partially within, the airgap of magnetic concentrator 54.

The portion of base unit 20, from flange 39 downward, is encased in a high dielectric insulator, having outer flanges, such as flange 23, which substantially increase the external electric arcing path on the outer surface of the base unit 20. Those skilled in the art know what material or combinations of materials could be used, such as, but not limited to, a high dielectric elastomer, rubber, silicon rubber or various other materials. Such outer coverings, or sleeves, are commercially available and may be stretched, form-fitted, previously molded or cold or heated, shrink-fitted to the body of the insulated device. Other suitable outer surface layers may be utilized having high dielectric insulation, suitable by having high voltage breakdown, weathering and temperature withstanding characteristics.

FIG. 5A is a side elevation, cross-section view of the magnetic concentrator 54, in relation to the current carrying cable 12 and the optical current sensor 40. As illustrated in FIG. 5A, the optical current sensor 40 comprises a polarized light input 42, a light directing device, which in this embodiment is a reflective prism 44, and a light output 46. The polarized light input 42 is operably connected to receive and polarize the light beam from a light source 48, which may be by way of example, but not limited to, a LED or a laser, and the light output 46 is operably connected to provide a light output to a light analyzer 50. Polarized light is directed into the reflective prism 44 as a polarized light beam 52. In the reflective prism 44, the portion of the polarized light beam 52, parallel to the magnetic field, (the horizontal portion in the Fig.) is rotated in its polarization by being exposed to the magnetic field. The rotated, polarized beam of light is reflected out the light output 46, and to the light analyzer 50 which senses this rotation, which represents the current level, (and many other characteristics of the current), and the current direction in the cable.

Figure 9:
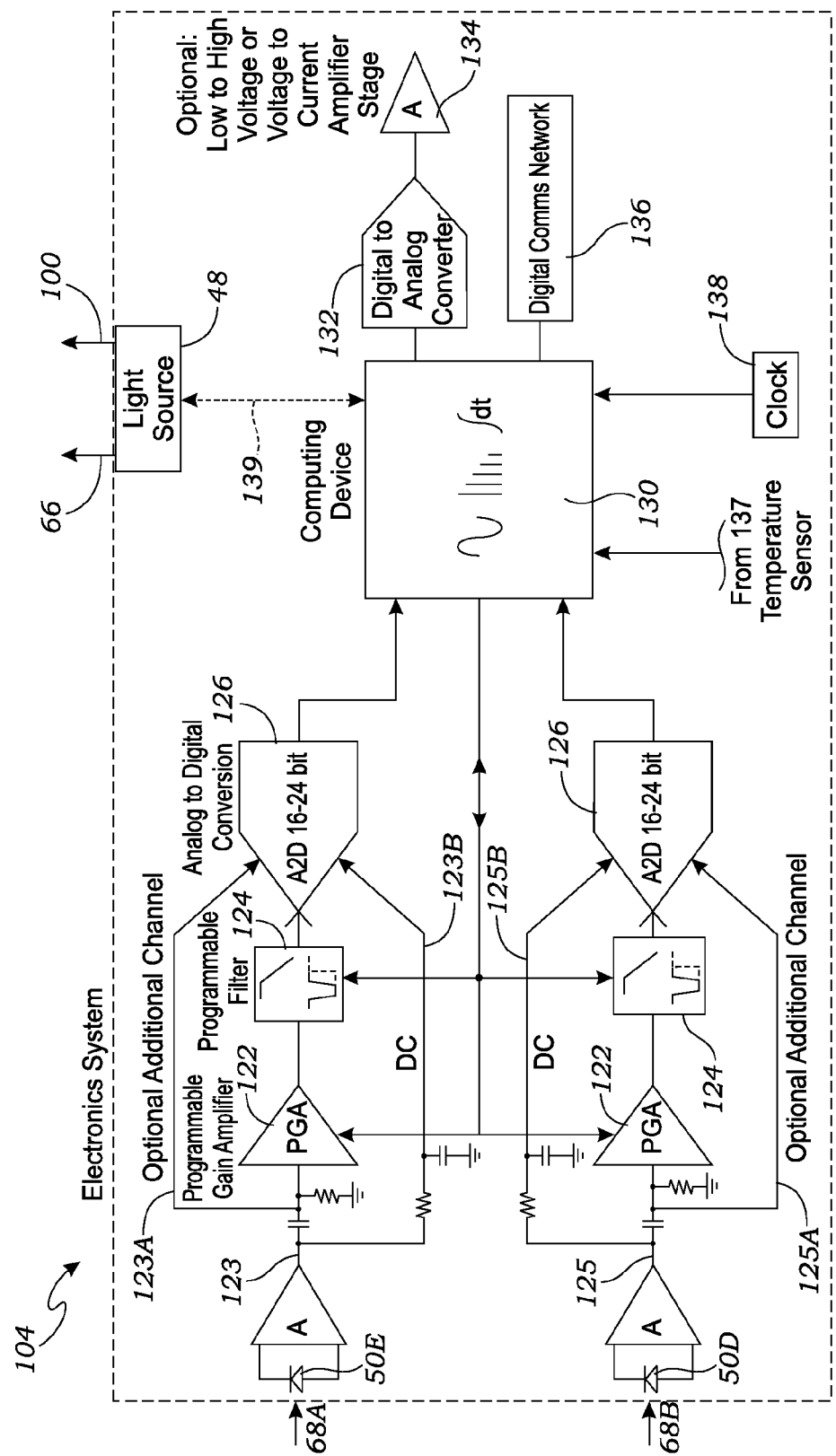
FIG. 9 is a schematic diagram of one embodiment of the electronics systems of FIGS. 8A-8D, which electronics systems, among other capabilities, process, analyze and evaluate the information as to the current in the cable and provides outputs therefrom.

Light detectors, (not shown, but shown in FIG. 9), as part of the light analyzer, but in this embodiment located remotely in the electrical system 104, FIG. 9, convert the light signals into electrical signals so that they can be analyzed and evaluated by an electronics system.

In the discussion herein, the words "optical," "optics," "electro-optical" and the like are used for brevity and clarity. However, it is intended that those words, as used herein, are intended to cover frequencies of electromagnetic radiation not only inside the visible spectrum, but also frequencies outside the visible spectrum. Such meanings are commonly accepted. See Wikipedia.org, also Webster's II, New Riverside University Dictionary, 1984 Ed. Also, it is commonly understood by those skilled in the electro-optical art that "light" and "polarized light" include both frequencies inside and outside of the visible spectrum. Examples of "light" outside the visible spectrum which offer possibilities of use, are infrared and ultraviolet frequencies. Of course, the selected frequency or frequencies are those, preferably, for convenience, economics and reliability for which there are suitable electrical components available as to sources, conductors, transmitters, detectors, and so forth. Near infrared frequencies, say, for example, but not with limitation, 800 nm to 900 nm are well-suited for meeting the requirements for application to the optical sensor assembly 10 described herein and also for which there are suitable electrical components readily available Infrared frequencies, particularly, the near infrared, are those commonly used in similar optical devices and are suited for use herein.

As illustrated in FIG. 5A, the magnetic concentrator 54, has a first end 56 and a second end 58 that together define an airgap 60 therebetween. The magnetic concentrator 54 is mounted, within a housing 30 that is pivoted, (not shown), so that it fits around the current carrying cable 12 when the base unit 20 is hung from the current carrying cable 12 by the at least one hook 26. When the concentrator housing 30 is moved to the closed position, the reflective prism 44 is operably positioned in the airgap 60 of the magnetic concentrator 54.

The distance "D" between the magnetic concentrator 54 and the current carrying cable 12 is adjusted so that magnetic concentrator 54 creates an optimum magnetic output, or, at least, a "suitable" output.

The optical current sensor 40, in operation, is positioned in airgap 60 to sense the current in the cable 12. Optical current sensor 40 has a clearance within the airgap 60, which helps to reduce sensitivity to temperature. It has been determined that the width of the airgap 60 depends on the length of the magnetic concentrator 54. The longer the magnetic concentrator, the greater the airgap may be. In the embodiment shown, a magnetic concentrator of 7 or 8 inches in length would allow using an airgap of about ¾ of an inch or an inch. Clearance of the reflective prism 44 of the optical current sensor 40, within said airgap 60, constructed as shown in FIG. 5A, is about 1/10 of an inch. Such airgap construction considerably reduces the sensitivity of the system to temperature. In general, the wider the airgap and the clearance of sensor 40, the less sensitivity of the system to temperature.

A wider airgap 60 provides a wider and more accurate dynamic range of current sensing by the reflective prism 44. A light directing device, such as reflective prism 44, in the preferred embodiment herein, that is wider (that is, longer within the airgap and, thus, providing a longer light path exposed to the Faraday effect), provides a better output light signal with a higher signal-to-noise ratio.

The path of the beam within the light directing device, prism 44 in one embodiment, is preferably closely aligned with the lines of force of the magnetic field. If this is done, a more precise, rotated output and, consequently, more precise electrical signals can be generated therefrom. Depending on current sensor 40, and, particularly the light directing device, such as prism 44, other angular alignments may be found suitable.

The light directing device, which, in FIG. 5A is a reflective prism 44, but, it may be any shape, prism or otherwise, that directs the light from the polarized light input 42 to the light output 46. In the present embodiment, the reflective prism 44 is a prism having a pair of sloped reflective surfaces 62 for directing the beam as described above. Glass provides benefits such as low temperature sensitivity. Other materials and shapes of reflective prism 44, its reflective surfaces and fiber optics configuration may alternatively be used. Some of such possibilities are illustrated hereafter in FIGS. 10 through 15.

The light directing device may be a material selected from the group of near optical grade glass, or better, bulk glass, diamagnetic glasses, crystals, including, particularly, ferromagnetic crystals, polymers, doped polymers and other materials, having polarized light directing properties and susceptible to the Faraday effect upon such polarized light, and having minimal temperature sensitivity or having a temperature sensitivity that can be suitably corrected or compensated for.

Many optical grades of glass or near optical grade and other bulk glass items are well-suited for a light directing device, including for a reflective prism. Some of the most sensitive materials of this kind are diamagnetic glasses and magnetic crystals, determined by a study in the Department of Electrical Engineering, Maryland University, College Park, Md., published in Magnetics, IEEE Transactions on May, 1997, Vol. 33, Issue 3 and updated on Aug. 6, 2002.

Other glasses, crystals, polymers, doped polymers and various other materials, mixtures and compounds may be found suitable, provided they conduct polarized light, are susceptible to the Faraday effect for a suitable range of current causing a rotation of the polarized light, and have minimal temperature sensitivity, or a temperature sensitivity that can be corrected, compensated for, calibrated for or otherwise accounted for. They should also have a suitable frequency response to provide information suitable for analysis and evaluation of one or more of spectral content, harmonics, stray frequencies, and other factors in determining quality.

Glass, crystal or other materials may well be found suitable for the light directing device herein, if they are transmissive of polarized light beams, magneto-optically sensitive to the Faraday effect, capable of sensing a wide bandwidth of magnetic frequencies, have a wide range of response to magnetic fields and have no deficiencies, including temperature sensitivity or other deficiency, that cannot be corrected for, by monitoring, or by "look-up" tables or mathematical formulas in a computing device or by other means.

From any such light directing device the optical sensor assembly 10 combined with an electronics system, as described hereafter in connection with FIG. 9, can provide the capability for determining current quality, which is hereby defined as including one or more of identification, measurement, display and indication, analysis, evaluation and reporting of one or more of current levels, spectral content, harmonics, transients, impedance, faults, fault locations, surges, spikes and power factor and any other characteristics of value or of interest.

Of course, determination of impedance would require some knowledge as to voltage in the system and determination of power factor could be determined by having voltage zero cross-over information.

The beam of polarized light 52, at some intermediate length within reflective prism 44, is, preferably, closely aligned parallel with the magnetic field in the airgap 60. The magnetic field in the airgap 60 rotates the plane of polarization of the polarized light 52 within the reflective prism 44. This is also sometimes referred to as a "shift" between polarized light components. The amount of rotation is proportional to the strength of the magnetic field in the airgap 60 and the amount of rotation is measurable by a light analyzer, such as the light analyzer 50, in order to determine the current in the current carrying cable 12. This is more fully illustrated hereafter in connection with FIG. 10.

In the embodiment of FIG. 5A, the magnetic concentrator 54 is D-shaped and includes a flattened portion 57, with the airgap 60 being positioned in an offset position at the edge of the flattened portion 57, so that the cable 12 in the embodiment shown passes through the airgap 60 during installation. In this embodiment, the magnetic concentrator 54 does not include any form of break or hinge within its body.

In the embodiment of FIG. 5A, the magnetic concentrator 54 comprises a powder core comprised of magnetic powder mixed with at least one type of non-magnetic material and having miniature distributed airgaps throughout the magnetic concentrator 54. This construction of powder cores is well-known and numerous powder magnetic cores are available.

A powder magnetic core having high saturation level and a narrow hysteresis loop, (to reduce the power loss), are utilized herein.

FIG. 5B, showing the magnetic core and cable in cross-section, illustrates another configuration of the magnetic concentrator 54 of FIG. 5A, showing magnetic concentrator 54A and an alternative location of the optical current sensor 40 within the airgap 60 formed between two magnetic concentrator segments 54B and 54C of the magnetic concentrator 54A. Current carrying cable 12 is shown within the central portion of magnetic concentrator 54A. The magnetic field of the magnetic concentrator 54A is carried through aluminum panel 79, (which lies between the upper part of the core 54a and the lower magnetic segments 54B and 54C, and is part of a larger structure enclosing items lying below magnetic concentrator 54A). The magnetic field extends through the aluminum panel 79 into magnetic segments 54B and 54C, which create a magnetic field in the airgap 60 which lies between them. The light directing device, in this instance, prism 44, is located within that airgap 60 and receives a beam of polarized light from polarizer 48B. Such polarized beam of light is then further rotated within prism 44, (in accordance with the magnetic field which is created by the magnetic concentrator 54A from current in cable 12), by Faraday effect, thus, providing much output information concerning current in cable 12, as polarized light to polarizing beamsplitter 50C from which two polarized light beams are provided to optical fiber light connections 50A and 50B.

Optical fibers 68A and 68B connect to receive the two output light beams of polarizing beamsplitter through fiber light connections 50A and 50B, without any optical sensor or amplifier. Of course, optical sensor or amplifier may be used, but it is preferred that nothing but simple optical fiber light connections 50A and 50B connect the optical fibers 68A and 68B to receive the outputs of polarizing beamsplitter 50C. The optical signals received from polarizing beamsplitter 50C, provides two polarized light beams which are strong enough to transmit through such optical fibers 68A and 68B to light detectors 50D and 50E, shown in FIG. 9.

Optical fibers 68A and 68B carry the output light beams to be turned into electrical signals by light detectors 50D and 50E at the input of the electronics system 10, as shown in FIG. 9. Such output information contained in optical fibers 68A and 68B because of the dynamic characteristics and ability of the magnetic concentrator 54A and great sensitivity and dynamic ability of electro-optical light directing devices, such as prism 44, includes a myriad of information concerning the current quality, including, but not limited to, current level, spectral content, harmonics, stray frequencies, transients, surges and spikes. Impedance and power factor may also be determined if voltage information is available.

Due to saturation, in the past, magnetic concentrators, which readily saturate, have limited the dynamic range of current sensing. An electric utility company has various requirements for the dynamic range of current to be measured, depending on the application. For example, the normal operating range would be from at least as low as approximately 5 amperes to about 600 amperes and a fault ranges of 10 time the normal operating range and, even, up to about 40 times the normal operating range. At those ranges, a ratio, or scaling, is required. Optical current sensing together with detection (changing "light" to electrical signals) provides ready ratio conversion, which is easily changed to another ratio, as necessary. The industry has agreed that a current ratio of about 100 amperes to 1 volt may generally be used, for normal operating range, which would allow 1000 amperes to be measured without distortion. However, for fault detection, a greater current ratio, say, 1000 amperes to 1 volt, measured in real time, would be required. Of course, rather than trying to fit excessive current into a range measurement system, a simple detector indicator could be used to determine and indicate when the current has exceeded 1000 amperes. Some other selected excessive value may be used as a maximum if required. This information could be provided, simply, when current exceeds the values within the normal current range or ranges.

On the other hand, scaling may, in effect, be determined, very simply, by a system that has a wide current sensing capability and the electronics system, particularly the computing device, merely utilizing the data pertaining to the current range of interest.

Wide ranges of core material are available and are commonly used for magnetic fields. Iron by itself, of course, has high permeability, but saturates at too low of a current level to be used for a wide range of sensing and measuring.

In a preferred embodiment of the magnetic concentrators herein, high saturation level is achieved by the magnetic concentrator 54 being compressed powder core comprised of magnetic particles dielectrically insulated from each other in a dielectric matrix and wherein there are minute distributed airgaps within the powder core. The powder core may be comprised of various magnetic powders. Some of such powders are iron-containing particles, silicon iron-containing particles, silicon steel-containing particles, and other mixtures, alloys, and compounds of iron and steel. Other magnetic materials may also be found useful in suitably raising the saturation level of the magnetic core twice and, even to as many as ten times, the normal current level of the system.

For lower current measuring, higher permeability cores are used and for higher current measuring, lower permeability cores are used. Suitable magnetic cores may also be constructed, for example, of laminations of silicon steel held together by one or both of an adhesive or an epoxy, or other suitable matrix. Smaller, narrower, lamination strips are useful for efficiency at higher frequencies of current detection and larger, wider, lamination strips are useful for lower frequencies of current detection. Laminations made of powdered core materials are also useful.

Narrow hysteresis curves in the magnetic concentrator are desirable and will substantially reduce the power losses and the measurements will be more linear, leading to more accurate measurements.

FIG. 6 is a cross-sectional view of laminated, magnetic concentrator 54 which includes numerous short, magnetic strips, laminations 64, arranged in laminar form. The laminated version is of at least one type of magnetic material mixed with at least one type of non-magnetic material. The laminations 64 are arranged to create the airgap 60. The mixed magnetic material greatly increases the saturation level of the magnetic concentrator 54, (the ability to portray high levels of current), while maintaining an acceptable sensitivity to low current. Thus, more effective use is made of the wide range of capability of optical current sensors such as optical current sensor 40. Of course, at low current levels, because of the low magnetic levels, steps may have to be taken to exclude extraneous magnetic fields by shields, screens or otherwise.

The magnetic concentrators 54 and 54A, in FIGS. 5A, 5B and the next Fig, FIG. 6, are low in cost, may be easily clamped onto existing cables 12 without cutting the cables 12, and provide a better dynamic range in comparison to prior art solutions.

The embodiment of FIG. 6, the magnetic concentrator 54 is shown as C-shaped. This allows the use of laminations and more standard components. The FIG. 6 embodiment further includes a hinge 59 to allow the magnetic concentrator 54 to open up and facilitate installation around a current carrying cable, without disruption of the cable function.

While three embodiments of different shape magnetic concentrators are disclosed in FIGS. 5A, 5B and 6, the magnetic concentrator may be of any shape that functions to provide the necessary magnetic field to an airgap within which an optical current sensor can be placed.

By properly selecting the magnetic concentrator 54 and adapting the electronics, the sensors can be used for multiple applications. For example, assume a 600 ampere nominal current sensor 40 is capable of measurement of very high momentary fault current (e.g., approximately equal to or greater than 5,000 amperes). The electronics are fast, high in bandwidth, but lower in gain and accuracy at that level. For current less than 1 ampere it is desired to measure at a lower bandwidth for several reasons. A normal harmonic content should be less than 5% and 5% of 1:600 ampere is negligible (0.000083 ampere) for metering and for quality of power. Therefore, a bandwidth of about 200 Hz is acceptable at this current. Current state of electronics allows dynamic adjustment of the gain and the bandwidth. The system disclosed is capable of filtering, through the use of filters or by computer data processing and, thus, is able to provide information down to 0.1 Hz.

The lower limit is the noise floor of the signal being processed, which is determined mostly by the source of the beam(s) and of the electronics, and the higher limit is the current at, or just below, saturation of the magnetic concentrator 54 and the power supply levels of the electronics.

Figures 7A, 7B:
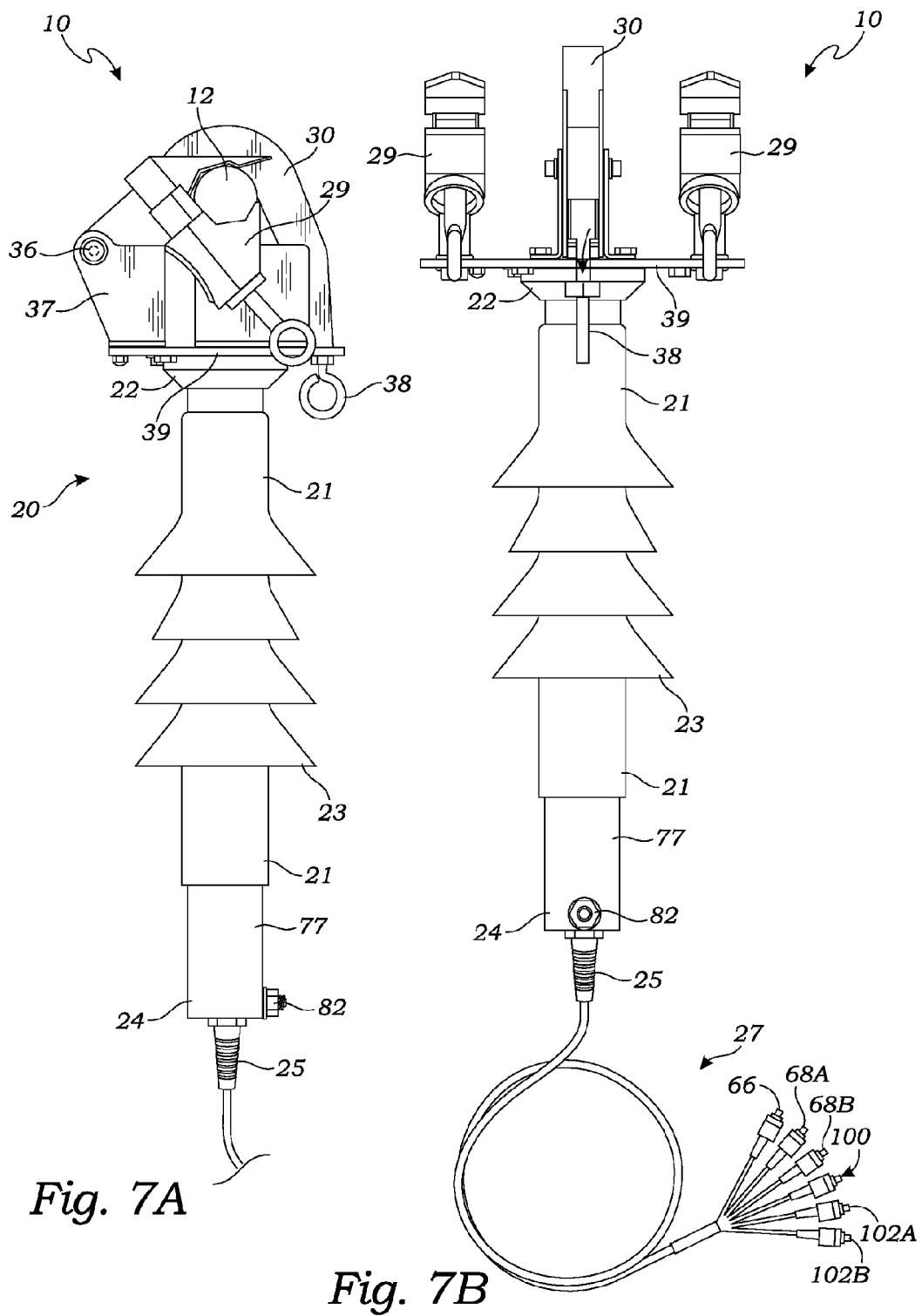
FIG. 7A is a side elevation view of a revised version of the optical sensor assembly, using an alternative mechanical structure of clamp and housing, using, for example, the alternative embodiment of magnetic core and sensor shown in FIG. 5B. The housing of the magnetic concentrator is shown in closed position and the exterior of the optical sensor assembly is shown.
FIG. 7B is a front elevation view of the optical sensor assembly showing the optical fiber cables attached at the bottom thereof.
Figures 7C, 7D:
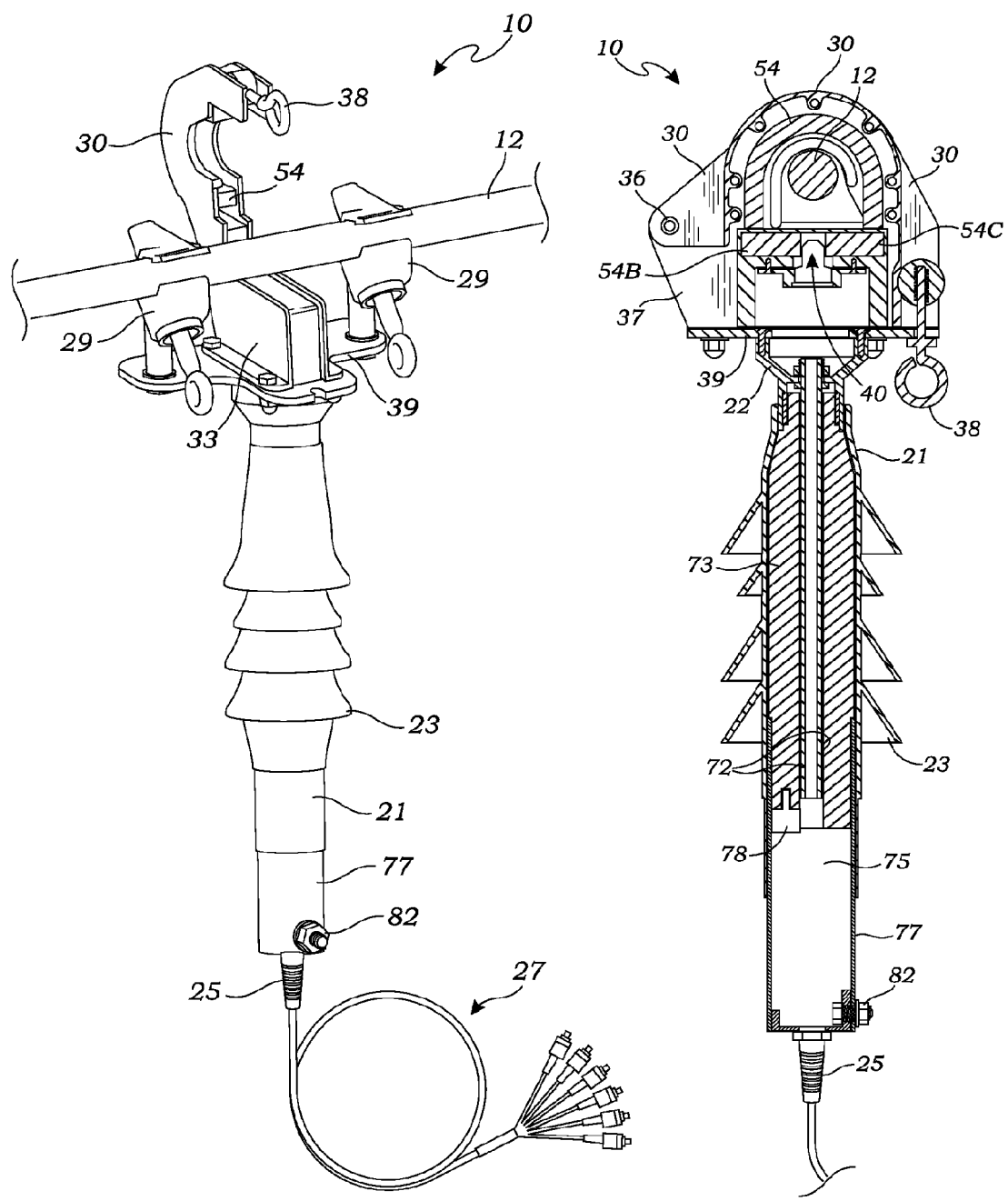
FIG. 7C is a front view of the optical sensor assembly, illustrating its exterior, with the magnetic concentrator open and showing the cable clamps holding a current carrying cable and the optical fibers extending from the bottom of the optical sensor assembly.
FIG. 7D is a side elevation view of the optical sensor assembly in partial cross-section, illustrating its interior.

Although a voltage sensor is not included in this application, optical fiber 100 may be made available to provide an input light beam, from a LED or laser, (which components are well-known in the art), to the voltage sensor area 78 shown in FIG. 7D. Optical cables 102A and 102B, FIG. 7B, provide the outputs from any voltage sensor placed in such voltage sensor area 78.

Thus, by the use of optical fibers, the electronics components may be located remotely from the high voltage cable, such that deteriorating effects of high voltage transients, lightning and other weathering conditions on the electronics parts can be reduced.

If a laser is used as the light source 48, the light beam produced by the laser will likely need to be depolarized and then collimated in order to be suitably polarized at the input to the light directing device, prism 44. If a LED is used as the light source 48, the light beam produced will need to be collimated in order to be suitably polarized at the input to the light directing device, prism 44. Of course, other light-emitting devices which are found suitable, may be used.

From the standpoint of overall management of an electrical distribution system, its safety, efficiency, reliability, and economics, determining the quality of current is of prime importance. Current quality includes determination of one more factors of current level, spectral content, harmonics, transients, impedance, surges and spikes and power factor. Determination of impedance and power factor would require some information as to voltage, including time of zero cross-over.

Computing devices (computers, digital signal processors, microprocessors, and the like), receiving information through the optical fiber cables, can readily provide the necessary evaluation and mathematical analysis to determine such factors of quality from electrical signals representative of current, (and, in the case of impedance and power factor some information as to voltage).

Of course, input from a voltage sensing system would provide additional desirable information about the quality of electricity being delivered by the distribution system. A voltage sensing system provides good capability for analyzing harmonics, transients, spikes and voltage anomalies in the system.

For assessment of power quality, the measurement of harmonics and other frequencies in the current is critical, so higher bandwidths, such as 45 Hz to 6000 Hz may typically be required. This is readily achievable in the system disclosed herein.

Smart grids deliver electricity from suppliers to consumers using digital measuring and monitoring technology to save energy, reduce cost, and increase reliability and transparency of grid conditions. With such smart grids, utilities and industrials will require that the same sensor be used for multiple ranges and purposes. Programmable gain amplifiers and variable filters controlled by a computer and frequency analysis within the computer itself, as taught herein, can optimize the information provided by the optical current sensor, as to current level, spectral content, harmonics transients, faults and other quality of power factors and analyze, evaluate and otherwise process and provide such information.

Thus, valuable additional information as to quality is provided.

Considerable information concerning harmonic measurement and analysis in power systems is found in IEEE Transactions On Instrumentation and Measurement, Vol. 55, No. 3, June 2006, article by Slobodan J. Petricevic, et al. Such information includes improving the sensing head, airgap, and frequency response and the harmonic analysis algorithm of a waveform.

Of course, in doing harmonic analysis, frequency selection and bandwidth selection the computing device 130, FIG. 9, is very capable. It may, for example, use filtering techniques, Fourier analysis, discrete Fourier transform (DFT), fast Fourier transform (FFT), and other analytical techniques well-known to those skilled in the art, to determine spectral content, harmonic, transients and other frequency content of electrical signals. This capability is in addition to the capability of the variable filters or fixed filters whichever may be also used.

FIG. 7A is a side elevation view of a revised version of the optical sensor assembly 10, using an alternative mechanical structure of clamps 29 and housing 30 and the alternative embodiment of magnetic concentrator, (not visible), that is shown in FIG. 5B. The magnetic concentrator and its housing 30 are in closed position and the exterior of the optical sensor assembly 10 is shown. Housing 30 opens and closes by being connected through a pivot 36 to an upright panel 37 on flange 39 which furnishes a mounting base for the upper elements of optical sensor assembly 10. Under flange 39 lies a collar-like top end 22 of lower base unit 20. Flange 39 and top end 22 are electrically connected and are electrically conductive of the voltage on cable 12 when the optical sensor assembly 10 is clamped to such cable 12. Clamp 29, which is adjustable by locking element 38, is shown clamped on cable 12, holding it firmly with respect to the optical sensor assembly 10. There are two of such clamps 29, one on each side of housing 30. The second clamp 29 on the far side is not visible in this view.

There is shown an exterior covering 21 of a high dielectric shielding material of rubber, silicone rubber or other suitable high dielectric as discussed previously in connection with FIGS. 3 and 4. Such exterior covering 21 has a number of outer flanges 23, as previously described, which increase the exterior arcing path.

At the bottom of the optical sensor assembly 10 is shown a pass-through connector 25, through which the optical fibers and any other necessary or desirable light or electrical conductors may pass. Ground stud 82 is also shown.

FIG. 7B is a front elevation view, of the optical sensor assembly 10 showing several optical fiber cables 27 which are connected to pass into the interior of the optical sensor assembly 10. Both clamps 29, on opposite sides of housing 30 are shown.

Optical fiber cables 27 includes optical fiber cable 66 for providing input light to the light directing device, (prism 44, in this embodiment, see FIG. 5B), of optical current sensor 40, and optical fiber cable 68A and 68B for providing the output from the optical current sensor 40 to the electronics system 104 of FIG. 9. Provision is made for inclusion of a voltage sensor, see FIG. 7D, by providing input light to the voltage area 78 on input optical fiber cable 100 and output is received from such a voltage sensor, if one is included, on output optical fibers 102A and 102B.

It appears that a multi-mode optical fiber works well for transmitting light from an LED light source. A single-mode fiber works well for transmitting light from a laser light source.

Of course, if an optical fiber is to be used to carry polarized light, it must be of a type that maintains that polarization. Polarization maintaining optical fibers are readily available commercially.

FIG. 7C is an isometric, frontal view of the optical sensor assembly 10, illustrating the magnetic concentrator housing 30 open and, thus, the magnetic concentrator 54, within the housing 30 is also open. The cable clamps 29 are shown. Optical fiber cables 27, extending from the bottom of the optical sensor assembly 10, are also shown.

There is also shown another housing 33 disposed on and firmly attached to flange 39. Such housing 33 has within it, two spaced apart segments 54B and 54C, (not visible, but visible in the next illustration FIG. 7D), of the magnetic concentrator 54, with an optical current sensor 40, (not visible, but visible in the next illustration, FIG. 7D), disposed in the space between them. Such space is the airgap 60, (not visible, but visible in FIG. 5B), of the magnetic concentrator 54.

FIG. 7D is a side elevation, partial cross-section view of the optical sensor assembly 10, illustrating the interior thereof. The optical fibers entering the assembly 10 at 25 and extending up through channel 72 and connecting to optical current sensor 40 are not shown. In operation, with the optical sensor assembly 10 clamped to a current carrying cable 12, the housing 30 and magnetic concentrator 54 therein, are pivoted into closed position, as shown, and are locked in place to flange 39 by locking element 38.

Magnetic concentrator 54 has two additional lower magnetic segments 54B and 54C which continue the magnetic field created by magnetic concentrator 54 and which form an airgap between them. Optical current sensor 40, or, at least prism 44 thereof, is disposed within such airgap and any polarized light passing through optical current sensor 40 is exposed to the magnetic field in that airgap between the magnetic concentrator segments 54A and 54B.

A light beam, (from a LED, laser, or other suitable light source, as previously and hereafter described), is brought into the optical sensor assembly 10 by means of one of the optical fibers in optical fiber cables 27, (not shown, but see FIG. 7C), that enters the bottom of the optical sensor assembly 10 through pass through connector 25 and which optical fiber cables 27 pass on up through centrally located electrically conductive channel 72 which may be made of aluminum, stainless steel or other conductive material, such as, but not limited to, metallic screen/mesh or one could chemically or mechanically apply a metallic coating to said cables 27 for the desired length.

Conductive channel 72 is electrically attached to collar-like, top end 22, which is likewise conductive and which, in turn, is connected to electrically conductive flange 39, which is connected electrically to cable 12. Of course, other connections may be used to electrify conductive channel 72.

Conductive channel 72, which is preferably a tube, protects the optical fiber cables 27 running therethrough from high electrical e-fields and the associated stresses.

Silicone gel is one of many suitable dielectric sealants known to those skilled in the art for use in high voltage equipment. The sealants are applied to avoid voltage breakdown. Wherever there is a high voltage gradient such high voltage sealants may well be used to prevent short-circuit breakdown.

The optical fiber cables 27, (seen in FIG. 7C), has therein an input optical fiber 66, seen in FIG. 7B, which has a polarized light beam therein, provided by a light source located in the electronics system 104. See FIG. 9.

In FIG. 7D, optical fiber cables 27 includes input optical fiber 66 which enters into the optical current assembly 10 through connector 25 and passes up through conductive channel 72 and provides an input beam of light to optical current sensor 40. Such beam of light may or may not have been polarized and/or collimated or otherwise conditioned, as necessary or desirable. If the beam of light is not yet polarized, it is polarized at the entrance to optical current sensor 40. While in optical current sensor 40, especially in prism 44, thereof, the polarized light beam is exposed to the magnetic field of airgap 60, (see FIG. 5B), which causes, by Faraday effect, rotation of the polarization of the light beam in accordance with the current flowing in cable 12. Such light beam passes through and on out of optical current sensor 40 as two light beams, having, preferably, passed to output through a polarizing beamsplitter, (not visible, but see FIG. 10, for an example), within optical current sensor 40. Optical fiber cables 27, includes two output optical fiber cables, 68A and 68B, see FIG. 5B, which carry such two rotated, polarized light beams back down through centrally-located conductive channel 72 to leave the optical sensor assembly 10 at the bottom and proceed to light detectors 50D and 50E, (see FIG. 9), for changing the light beams into electrical signals for further evaluation, analysis and data processing.

Within the central portion of the optical current assembly 10 is a dielectric housing 73 which provides rigidity and dielectric soundness. Empty area 75 is encased within a conductive metal tube 77 made from stainless steel, aluminum or other suitable material which is electrically grounded by ground stud 82. Such tube 77 extends upward from the bottom of the optical sensor assembly 10 until it reaches an area in proximity to the level occupied by conductive channel 72, which carries the voltage potential of cable 12. Thus, there is a voltage field space 78 created between grounded tube 77 and conductive channel 72 within which a voltage sensor, (none shown), may be inserted and connected.

Figure 8A:
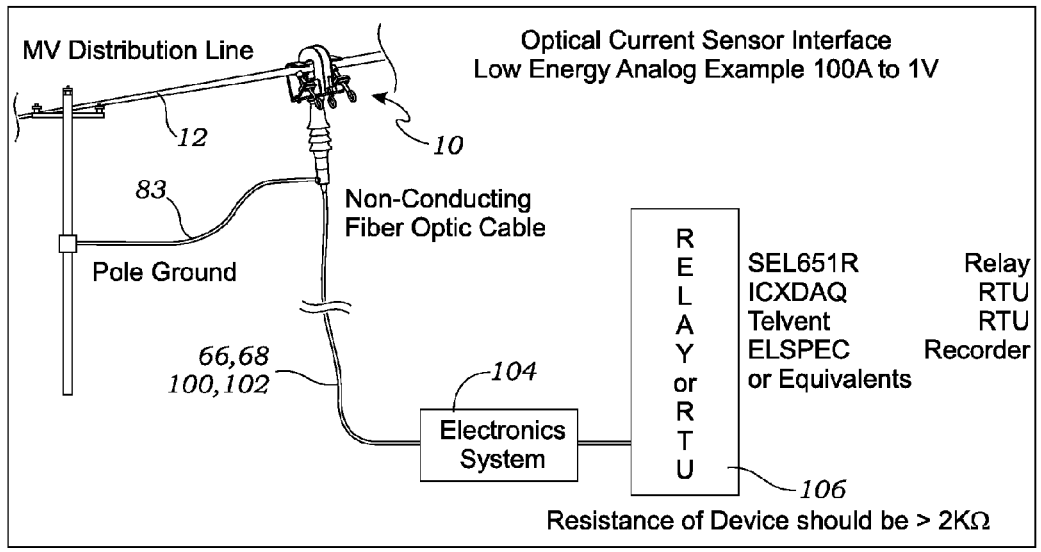
FIG. 8A is an illustration of the optical sensor assembly according to one embodiment of the disclosure, wherein the assembly is suspended from a current carrying cable of a high voltage electrical distribution system and connected to an electronics system for analysis and/or other evaluation of the current in the cable and thence connected, at its output, to further components or systems.

FIG. 8A illustrates an arrangement for the optical sensor assembly 10 according to an embodiment of the disclosure, wherein the optical sensor assembly 10 is suspended from the cable 12 in a high voltage electricity distribution system, and is connected to an electronics system 104 for control and/or other evaluation of the current and voltage levels, (if a voltage sensor is included), by means of fiber optics cables 66, 68, 100 and 102. An electrical ground is shown obtained by connection 83 to a ground pole of the electricity distribution system. Of course, an electrical ground may be obtained in many other ways and places.

As illustrated, the output optical fiber 68, (which likely is actually two optical fibers, 68A and 68B,) contains current information which is provided to the electronics system 104, which includes a computing device 130, (not shown, but see FIG. 9) which may be a microprocessor, computer, digital signal processor, (DSP), or the like.

Similarly, optical fiber 100 provides a beam of light from a light source in the electronics system 104 to a voltage sensor, (if one is installed), in voltage field space 78, FIG. 7D. Optical fiber 102 (which may well be two optical fibers 102A and 102B, FIG. 7B, because of beam splitting), provides light information as to the output of a voltage sensor, if included, to the electronics system 104, for processing.

The output of electronics system 104 may be fed to a relay or remote terminal unit 106 for transmission to other systems, if desired, some of which are listed next to relay or remote terminal unit 106. One of such systems, for example, might be a recorder with time labeling or stamping. Various capable recorders are commercially available for fast recording of date and information and further analyzing such data and information. Interface is easily made to products, such as Telvent, Elspec and other products, of other companies.

Figure 8B:
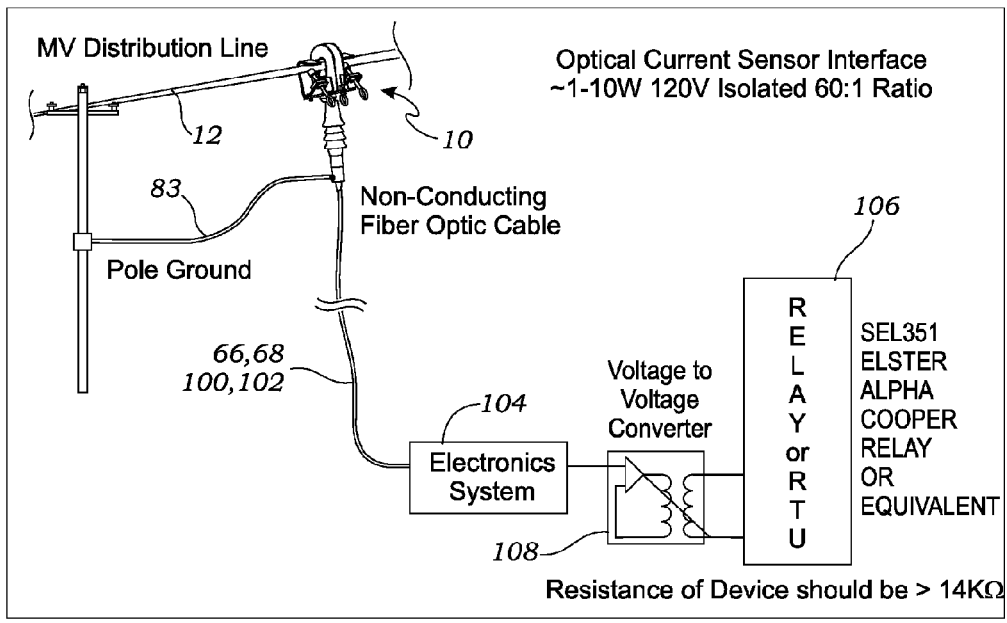
FIG. 8B is an illustration of a second embodiment thereof in which the output is connected to possible alternative components or systems.
Figure 8C:
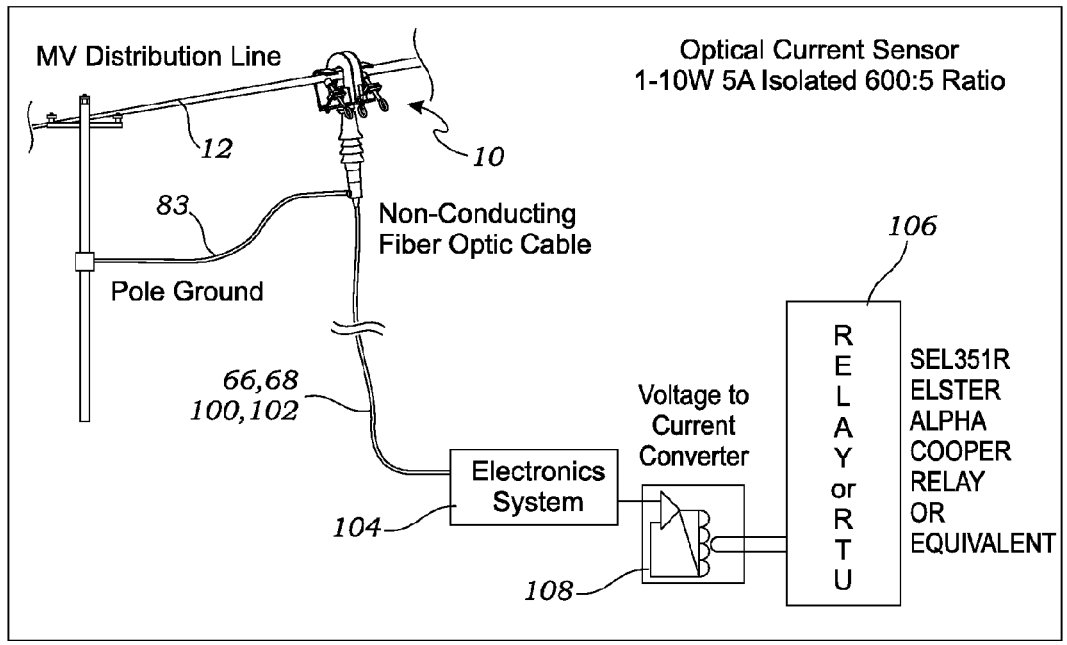
FIG. 8C is an illustration of a third embodiment thereof.
Figure 8D:
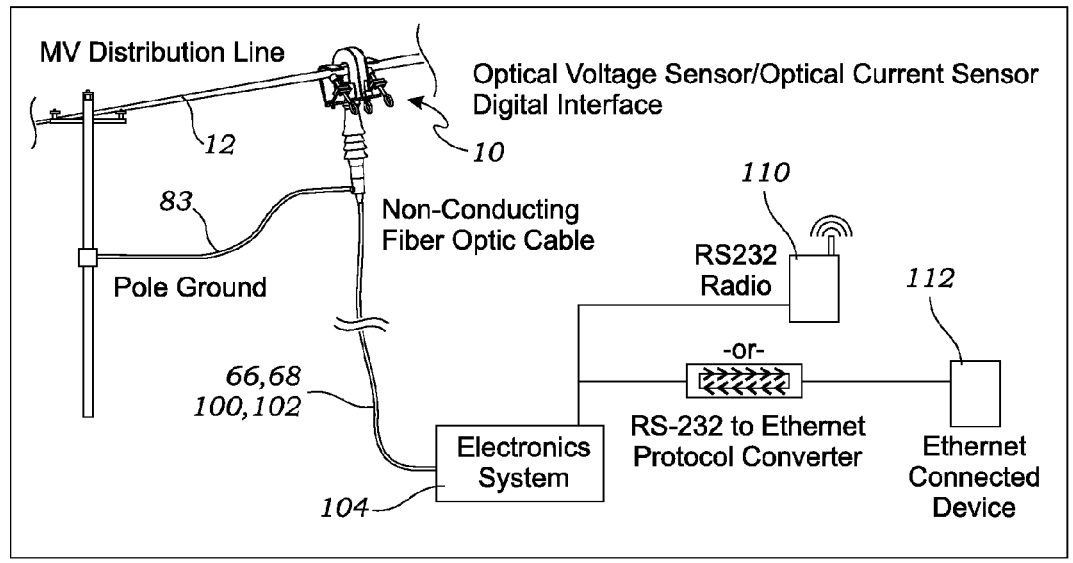
FIG. 8D is an illustration of a fourth embodiment thereof illustrating outputs to wireless and wired communications systems.

Other configurations are also possible, as illustrated in FIGS. 8B-8D. In the embodiment of FIG. 8B, the electronic system unit 104 is connected through isolating converter 108 to the relay or remote terminal unit 106 which may interface with various other company products having various capabilities pertaining to the data and information created by electronics system 104.

In the embodiment of FIG. 8C, the relay or remote terminal 106 is shown interfacing with possible additional product lines. In the embodiment of FIG. 8D, the electronic system 104 is operably attached to wireless devices such as radio 110 using RS232 telecommunications standard and/or Ethernet connected device 112, a device that would implement and use networking standards. Therefore, the output data may be provided in format or protocol for use in either wireless or wired communications.

FIG. 9 is one example of an electronics system 104 shown in FIGS. 8A, B, C and D, wherein the light detectors 50D and 50E, (which may be photodiodes or other light sensitive devices), of the light analyzer 50 (see FIGS. 5A and 10), are located remotely from the optical current sensor 40, in or near the electrical system 104. However, it would be possible to put such light detectors at or near the optical current sensor 40, but, preferably they are located as shown, at or near the data processing capability of the electronics system 104.

FIG. 9 also is a schematic diagram of one embodiment of the electronics systems 104 of FIGS. 8A-8D, which systems process, analyze and evaluate the information as to the current in the cable and provides outputs therefrom. FIG. 9 includes a device such as a computing device, a digital signal processor or a microprocessor or the like; FIG. 9 is one example of an electronics system 104 wherein the two beams of polarized light received on optical fibers 68A and 68B are detected and turned into electrical signals by light detectors 50D and 50E, which are shown as photo-diodes, but which may be any suitable detector for turning polarized light into electrical signals.

The light detectors 50D and 50E are the remaining elements of the light analyzer 50. See FIG. 10.

In FIG. 9, such light detectors 50D and 50E may handle multiple channels if they are multi-frequency capable. The embodiment shows such light detectors 50D and 50E as being "photodiodes" but they may be other light sensitive components such as, but without limitation, photo resistors or photo transistors.

In FIG. 9, the electrical signals from the light detectors 50D and 50E are connected through programmable gain amplifiers (PGAs) 122 and through other more direct channels such as 123A and B and 125A and B to analog to digital converters 126.

Figure 10:
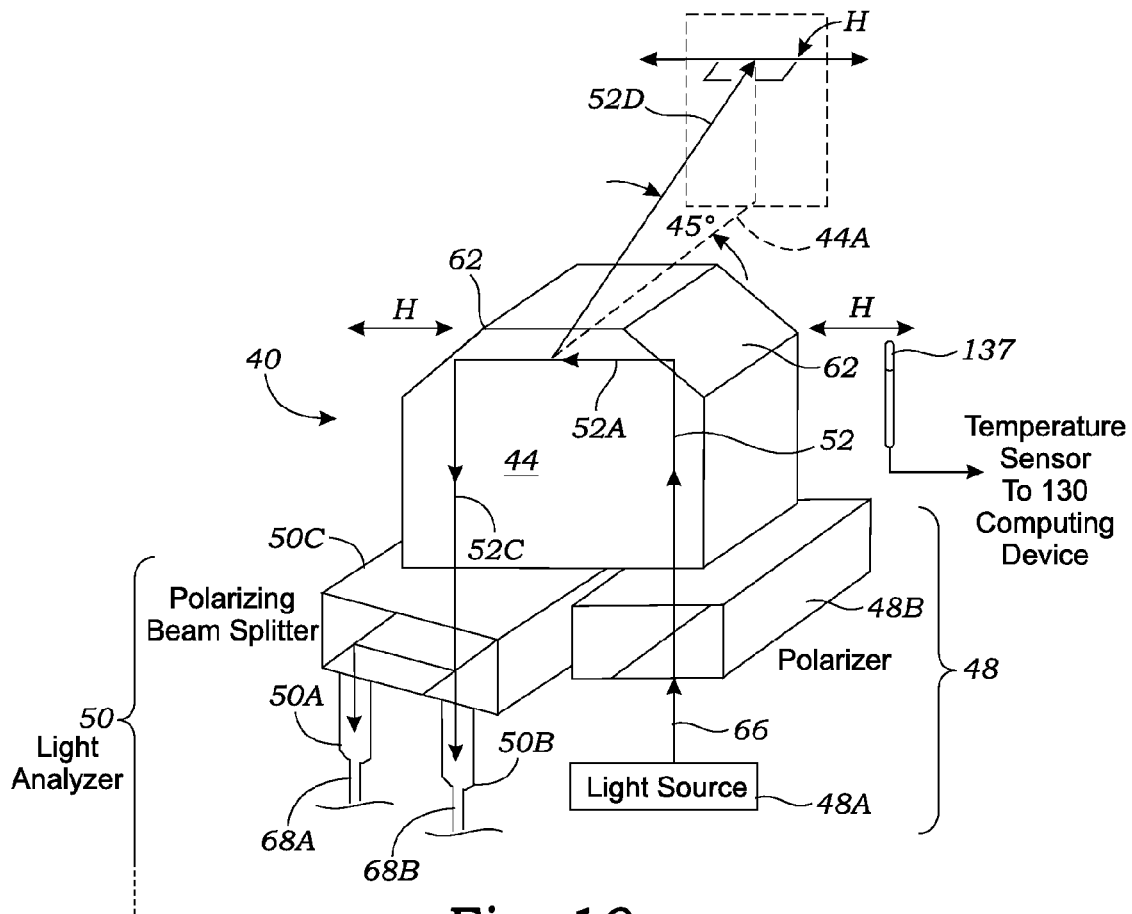
FIG. 10 is an illustration of an optical current sensor comprising a light source and polarizer providing polarized light which is transmitted through a light directing device and out into a polarizing beamsplitter and thence to the light sensors of a light analyzer.

It is noted that temperature information is received from a temperature sensor 137, illustrated hereafter in FIG. 10, placed near the prism 44, (which is somewhat sensitive to temperature), provides temperature information which can be used, for example, in the computer in a "look-up" table or in a formula or otherwise, to correct the readings of prism 44 which may be affected by temperature at the site of the current measuring.

A desirable feature, protective to both customer and distribution system, is to disable or disconnect, say, the main circuit breaker or selected portions of the customer's system or the distribution system, or any combination of them, upon detection of excessive current or excessive voltage by either the described electronic system of FIG. 9, or by separate excessive current detecting devices and excessive voltage detecting devices or by both. No such separate excessive current detecting system is shown, but components thereof are readily available comprising an excessive voltage sensor, a trip relay and a circuit breaker. Information concerning the relative timing of events is often very valuable and such measurement is considered one of the most important measurements in power utility grid control. The information thus provided gives better event detection and location, prediction of grid instability, reduction of blackouts, better load control such as desirable load shedding, isolation of inoperative areas, early detection of faults, prevent of blackouts and other evaluations that improve the quality and reliability of the power utility grid.

It is noted in FIG. 9, that a clock 138, in addition to the computer's own internal clock, is included in the electronics system 104. This is desirably included, (whether within or outside of the electronics system 104). Clock 138 is much more accurate than the standard microprocessor clock within the electronics system. Clock 138 is desirably synchronized, say, by satellite, (such as the Global Positioning System, (GPS)), with a reliable external time reference or otherwise synchronized to a standard source. In this manner, there could be provided and recorded a running time stamp for all events of interest being measured, analyzed or evaluated by the system. Of course, such clock 138 must have an independent, reliable source of power.

With such a clock 138 and continuous, accurate time information therefrom, a time stamp could be added to the signal or record of every event down to nanoseconds, but, inasmuch as it is running continuously, it may provide time indication for any event or interval desired. A continuous time stamping of data could be provided, if desired. If, for example, recording is done, as is often the case, of the output of the electronics system 104, or portion thereof, a time stamp of any events, or all events, may be recorded and preserved, from information provided by clock 138. A less accurate clock may also be included to give a broader, more general view of the sequence of events that are not of high frequency or short duration.

Also, within electronics system 104 is a light source 48, which may or may not be a polarized source, provides a beam of light, (probably in or near the near infrared frequencies, but not necessarily so), to optical fiber 66 which transmits it for use in current sensor 40, shown in FIG. 5A and FIGS. 10-12. Such light source 48, or an additional light source, may provide a beam of light for a voltage sensor, on output optical fiber 100, if a voltage sensor is included in the system. Dotted line 139 indicates a possible communication link, possibly with communication in both direction for better control, between the computing device 130 and light source 48 which would allow computing device 130 to control the light source 48, depending on its capabilities, as to one or more frequencies, one or more power output levels and as to any desired modulation of phase, frequency, amplitude, square wave, pulse, or other form of modulation.

In FIG. 9, the amplification channels may be divided into many channels in order to differentiate between the AC and DC components of the beam or to accommodate more than one sensor. In the present embodiment, the electronics 104 includes a first channel 123 and a second channel 125. Additional channels may also be included, within the present skill of those knowledgeable in the art. Also, as shown in FIG. 9, additional channels, such as 123A and B and 125A and B, around the PGAs 122 and filters 124, may or may not be included.

Channels 123A and 125A provide raw, AC electrical frequencies in the detected light beam, directly to analog to digital converters 126. Channels 123B and 125B provide raw, integrated, or smoothed, electrical frequencies in the detected light beam, directly to the analog to digital converters 126. Thus, additional information concerning the current flowing in the current carrying cable 12 is furnished directly to the computing device 130, through analog to digital converter converters 126, to be used in the digital processing of information.

The PGAs 122 may be of a type that receive commands from a computer bus. The commands may be bus discrete commands, such as by changing a resistor or voltage (as is done with a Voltage Control Amplifier) or current command or otherwise. This programming of the gain may be compared to Automatic Gain Control (AGC) as in the art of radio. The PGA's 122 may include low pass or band pass filters or variable band pass filters connected to separate filters 124. The filters 124 or filters which may be located within or near the PGA's 122 may include passive and/or active components. The filtered signal is directed to an analog to digital converter 126 that sends the digital signal to the computing device 130, which is a digital signal processor or a microprocessor or a computer or the like.

The symbols within computing device 130 indicate, in a general way, the capabilities of the computing device 130 to analyze an electrical wave, electrical waves of several frequencies, (including harmonics and stray frequencies) and to integrate, smooth or average the information.

In a preferred embodiment, the analog to digital converters 126 sample at 15 kHz. Using anti-aliasing filters of 5.64 kHz, (not illustrated) at the input to the programmable gain amplifiers 122 or, possibly, at the input to the analog to digital converters 126, the computer is enabled to determine harmonics and other frequencies up to the 53rd harmonic of a 60 cycle power distribution system. This enables comprehensive information concerning the spectral content and other quality factors of the current being analyzed and evaluated. A common requirement is information as to frequencies up to 15 kHz.

The computing device 130 controls one or more of gain, frequency, bandwidth or other filter capability, based on the received signal and the program installed on the computer. Computing device 130 controls the PGAs 122 and the filters 124, accordingly. The analog to digital converter 126 may include a separate analog to digital converter for each channel 123 and 125, or may include a single multi-channel analog to digital converter.

Scaling of current levels to be measured is easily accomplished by the computing device 130 changing the gain and bandwidth of the filters 124 and/or the programmable gain amplifiers 122, by control or by filtering within the computing device 130 or in other ways.

Also, for frequency analysis, fixed frequencies filters, either active or passive, in multiple channels, to the extent desired, may be located between the programmable gain amplifiers 122 and the computing device 130 in order to pass predetermined frequencies or bands of frequencies of interest.

The output information from electronics system 104, from computing device 130 may, for example, without limitation, feed an output to a digital to analog converter 132, and those analog electrical signals may be amplified by an amplifier 134 for further evaluation, analysis or other usage. In addition, computing device 130 may feed information to a digital communication network 136 for further distribution and usage of the information as previously explained in FIGS. 8A, B, C and D.

The electronic system 104 can be interfaced through analog or digital outputs. In one embodiment, the analog output can be a low energy output. For example, a ratio of 10,000:1 may be used for voltage, in this case 7200 volts on the cable 12 will be represented by 0.72 volts. See FIG. 8C. Other ratios can be provided. A current may also be represented by a voltage. For example, 500 amperes may be represented by 1 volt. This low energy analog interface will be generally connected to a Remote Terminal Unit (RTU), as shown in FIGS. 8A, 8B and 8C an Intelligent Electronic Device (IED), a Programmable Logic Controller (PLC), a Supervisory Control and Data Acquisition System (SCADA), or a relay or remote terminal unit 106, to send the information to a control system.

There may be cases wherein the optical sensor assembly 10 may be used for more than one application. For example, the assembly 10 may simultaneously be used for fault location together with regulating the quality of power. If necessary or desirable, more than one channel of analog to digital conversion may be used. The analog to digital conversion can be done by more than one analog to digital converters or a multichannel analog to digital converter. This "multi-channel gain" approach can also be implemented by software instead of hardware.

When legacy equipment is interfaced with the sensors, such as revenue meters or old relays, power amplifiers may be added (to mimic instrument transformers) to the analog output. A typical voltage to a meter in the United States is 120 volts, so a ratio of 60:1 will provide 120 volts when the cable 12 has 7200 volts. Other voltages up to 1,000 volts are available. A voltage to current amplifier may be connected to the analog output; for example, a 600:5 ampere ratio is typical in the United States.

For more modern smart grid applications, the digital output may be used. The most common are the RS-232, (wireless), and/or the Ethernet (wired). As shown in FIG. 8D the computing unit 130 may be programmed to utilize whichever is the standard protocol in the customer region.

FIG. 10 is an illustration of a light source 48A and a polarizer 48B providing polarized light 52 which passes into reflective prism 44 and is reflected as shown by light beam 52A where it is then affected by the magnetic field, due to the Faraday effect. The polarization of the light beam, in a preferred embodiment, is orthogonal to the magnetic field as shown by line 52D representing the polarization direction of polarization of light beam 52A at an angle of 45 degrees upward from the top plane of prism 44, (which is parallel to the plane of reference for the beam 52A within prism 44), as can be seen with reference to dotted line 44A which lies parallel to the plane of the top of prism 44. The polarized light beam 52A is rotated in its polarization by magnetic field H, but stays orthogonal to magnetic field H as can be seen in the drawing. In other words, the 45 degree angle increases or decreases, caused by the Faraday effect of a magnetic field on polarized light. Subsequently, the rotated, polarized light beam 52A is reflected into light beam 52C which then passes out of the prism 44 to optical fiber light connections 50A and 50B of light analyzer 50. The output information is then sent to the electronics system of FIG. 9 on optical fibers 68A and 68B.

The light analyzer 50 is connected to receive said rotated, polarized light 52C output and provide electrical signals representative of the current flowing in said cable. In the embodiment shown the light analyzer 50, (which is shown, except for the light detectors 50D and 50E included remotely at the input to the electronics system 104 shown in FIG. 9), is comprised of a polarizing beamsplitter 50C which provides two output polarized light beams containing a myriad of information concerning current in cable 12. Optical fibers 68A and 68B are connected to receive the two polarized beam outputs from polarizing beamsplitter 50C, by optical fiber light connections 50A and 50B. Optical fibers 68A and 68B transmit the two polarized beam outputs to light detectors 50D and 50E, for conversion into electrical signals as can be seen at the input to FIG. 9.

In FIG. 10, the polarizing beamsplitter 50C is disposed at 45 degrees to the prism 44. Of course, the polarizing beamsplitter 50C may be constructed as a single device or as two devices, a polarizer and a beamsplitter. The term "polarizing beamsplitter" is intended to cover both a combined device and two separate devices.

Other light analyzers may be used, such as those involving polarizers, beam splitters, quarter-wave plates, half wave plates, sensors, photodiodes, photo transistors, and other light analyzer and detector means known to those skilled in the art.

Preferably, the light detectors 50D and 50E, which are part of light analyzer 50, are located remotely from the main body of optical sensor assembly 10. In FIG. 9, light detectors 50D and 50E are shown remotely located in the electronics system 104.

The accuracy and the range of light directing devices, such as prism 44, are often influenced by temperature. The accuracy and range of measuring by prism 44, and, of course, various other suitable light directing devices, is increased substantially by temperature compensation. Consequently, a temperature sensor 137, placed in proximity to the prism 44, (or any other light directing device which may be used that is temperature sensitive), provides information as to the temperature of the prism 44 which information is fed to the computing device 130 as shown in FIG. 9. A previously determined look-up table of compensation, a mathematical formula, algorithm or other method, within said computing device 130 may be used to correct the output information of the light directing device and, thus, substantially extend the capability of the light directing device. In some instances, of course, calibration may be used. Numerous temperature sensors are readily available, using solid state devices, bimetallic devices, resistor-based devices and many other temperature sensing techniques. A popular one is to coat the tip of an optical fiber with a fluorescent paint that changes color with temperature. A photodiode then reads the color, and, thus, the temperature, of the fluorescent paint. A suitable range of a temperature sensor would be from −50 degrees C. to 100 degrees C., with an accuracy of 1 degree and a response time of, say, less than a minute. The range of frequency detection by the light directing device is much improved by temperature compensation.

It will likely be desirable to improve the internal reflection by controlling the refractive index of the adjoining material, (on the reflective surface or surfaces of the light directing device, prism 44 in this embodiment). One such method is to place "caps" on the outer side of the reflective surfaces of reflective, light directing devices entrapping a gas of known refractive index. The temperature coefficient of expansion of the cap must be closely related to the temperature coefficient of expansion of the light directing device. Thus, for a glass prism, the cap could be of the same material as the prism. Plexiglass, Ultem, a commercially-available resin, which may be glass-filled, and other materials may be found suitable in particular applications. The cap might be formed in the shape of, say, a baking pan, turned upside down and glued to the outer side of the reflective surface. The space within the cap may include, for example, but not limited to, nitrogen, argon or a hygroscopic material and trapped dry air.

Figure 11:
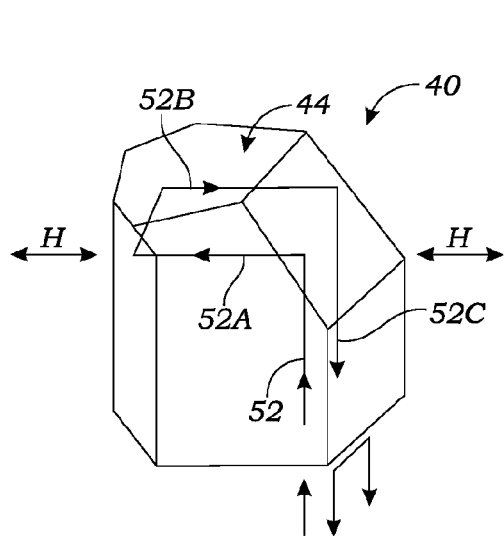
FIG. 11 is an illustration of a light directing device in which the polarized light passes twice through the light directing device and provides an output doubly affected by the Faraday effect.

FIG. 11 is an illustration of polarized light 52 passing twice through light directing device, prism 44. As seen by light beams 52A and 52B, the polarization of output light beam 52C will be doubly affected by the Faraday effect, caused by the magnetic field H. Inasmuch as the polarized light has traveled twice through prism 44, light 52A and 52B in opposite directions, miscellaneous "non-ideal" responses of the light directing device, prism 44, will be removed from the output signal.

Figure 12:
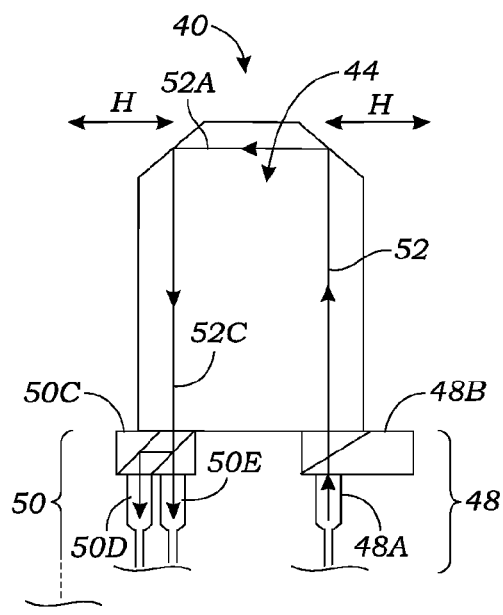
FIG. 12 is another illustration of an optical current sensor, showing a light source, a polarizer and, thus, polarized light passing through the reflective prism, to be affected by the Faraday effect of a magnetic field H. The light, passing out of the reflective prism to a polarizing beamsplitter is then turned into electrical signals by the light detectors.

FIG. 12 is another illustration of an optical current sensor 40, showing a light source 48A, a polarizer 48B and, thus, polarized light 52 passes through the reflective prism 44, to be affected by the Faraday effect of a magnetic field H. The light passing out of the reflective prism 44 to a polarizing beamsplitter 50C is then turned into electrical signals by the light analyzer 50. In this instance, the light detectors 50D and 50E, which turn light signals into electrical signals, are located at or near the light directing device, prism 44 and the outputs of light detectors 50D and 50E are electrically connected to electrical channels 123 and 125. See the relation of those two electrical channels 123 and 125 in FIG. 9.

It is recognized that FIGS. 10, 11 and 12 show the light and the light path in somewhat schematic form. A quick understanding or visualization of a beam of light and the light path in traveling through a translucent medium may be seen in FIG. 1, of U.S. Pat. No. 5,939,711 for Electro-optic Voltage Sensor Head. Such patent, although it involves "Pockels effect," a voltage field effect, instead of "Faraday effect," a magnetic field effect, is helpful in illustrating in FIG. 1, the passage of a beam of light through a translucent medium.

As may be seen in FIG. 12, the light source 48A may be located at or near the optical current sensor 40. On the other hand, the polarized light source may be located remotely and the light may be sent to optical current sensor 40 by fiber optic cable 66 as shown in FIG. 5A.

Similarly, the light detectors 50D and 50E, of light analyzer 50, in this embodiment are located at the output of the beamsplitter and polarizer 50C, close to the light directing device, prism 44. Alternatively, of course, the light detectors 50D and 50E may be located at a distance through the use of optical light sensors and optical fibers at the output of the beamsplitter and polarizer 50C. Such optical fibers would then be connected to the remote light detectors 50D and 50E.

Figure 13:
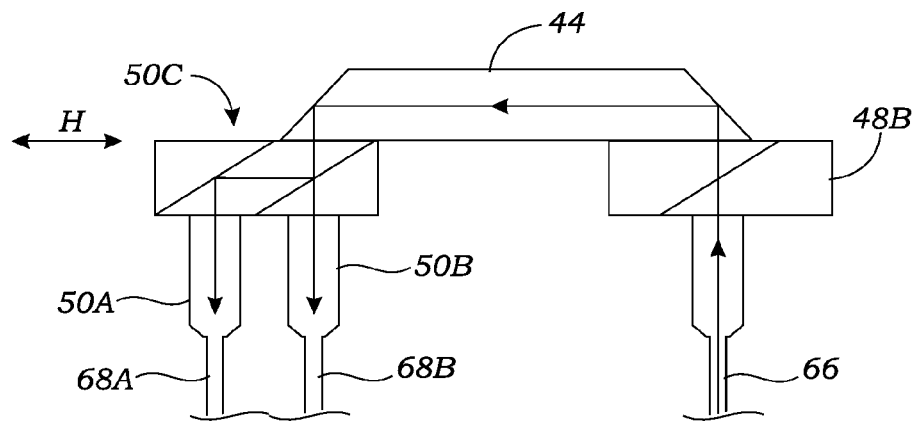
FIG. 13 is an embodiment of a light directing device in linear form, receiving light through an input polarizer and reflecting it through the light directing device wherein it is rotated by exposure to a magnetic field H. The light then travels to an output through a polarizing beamsplitter for further transmission of the light through optical fibers to light detectors.

FIG. 13 is an embodiment of a light directing device, prism 44, in linear form, receiving light through an input polarizer 48B and reflecting it through the light directing device, prism 44, wherein it is rotated by exposure to a magnetic field H. The light then travels to an output comprised of an output polarizing beamsplitter 50C. The two output polarized light beams are optically connected by optical fiber light connections 50A and 50B to optical fibers 68A and 68B, which optical fibers transmit them to light detectors 50D and 50E, for conversion into electrical signals as shown at the input to FIG. 9.

Figure 14:
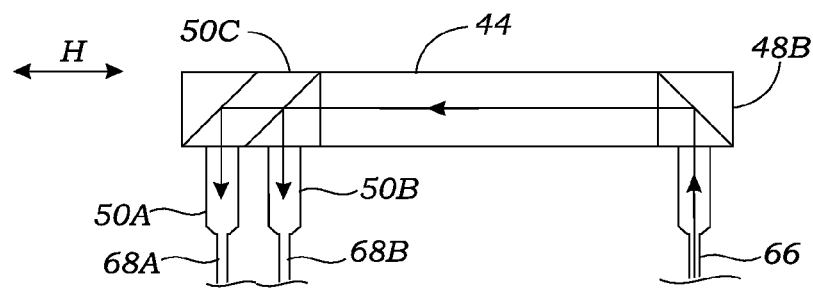
FIG. 14 is an embodiment in which the input light is in line with the light directing device. The input polarizer reflects the beam of light into the light directing device, wherein it is exposed to a magnetic field H and then reflected out from the light directing device by a polarizing beamsplitter.

FIG. 14 is an embodiment in which the input polarizer 48B and the output polarizing beamsplitter 50C are located in line with the light directing device, prism 44. The input polarizer 48B reflects the beam of light into the light directing device, prism 44, wherein it is exposed to a magnetic field H and then it is reflected from the light directing device, prism 44, by a polarizing beamsplitter 50C into optical fiber light connections 50A and 50B and thence through optical fibers 68A and 68B to light detectors 50D and 50E for conversion into electrical signals as shown at the input to FIG. 9.

Figure 15:
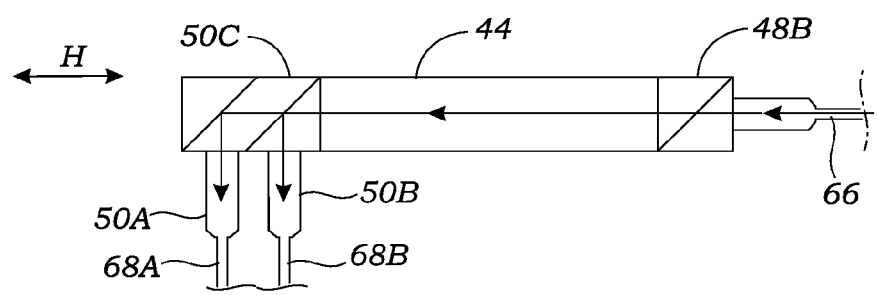
FIG. 15 is an embodiment in which the input light enters the light directing device without reflection and is reflected out of the light directing device by an output polarizing beamsplitter.

FIG. 15 is an embodiment in which the input light enters the light directing device, prism 44, without reflection, through an input polarizer 48B, and such light is then exposed to a magnetic field H and is then reflected out of the light directing device, prism 44, by an output polarizing beamsplitter 50C to optical fiber light connections 50A and 50B and thence through optical fibers 68A and 68B to light detectors 50D and 50E, for conversion into electrical signals as shown at the input to FIG. 9.

A voltage sensor, a sensor sensitive to Pockels effect, may be placed in the voltage field of the cable 12, as explained in connection with FIG. 7D, may be used in conjunction with this current sensing system to provide additional information about the system's condition.

FIG. 15 is intended to illustrate the polarizers and the beam splitter as distinct elements from the light directing device wherein such elements are adjacent to the light directing device. However, FIG. 15 is also intended to illustrate another embodiment of the light directing device in which one or more of the polarizers and polarizer beamsplitter are integral with the light directive device. Such integration may be accomplished as to bulk glass and various other light directive, or light transmissive, devices.

Figure 16:
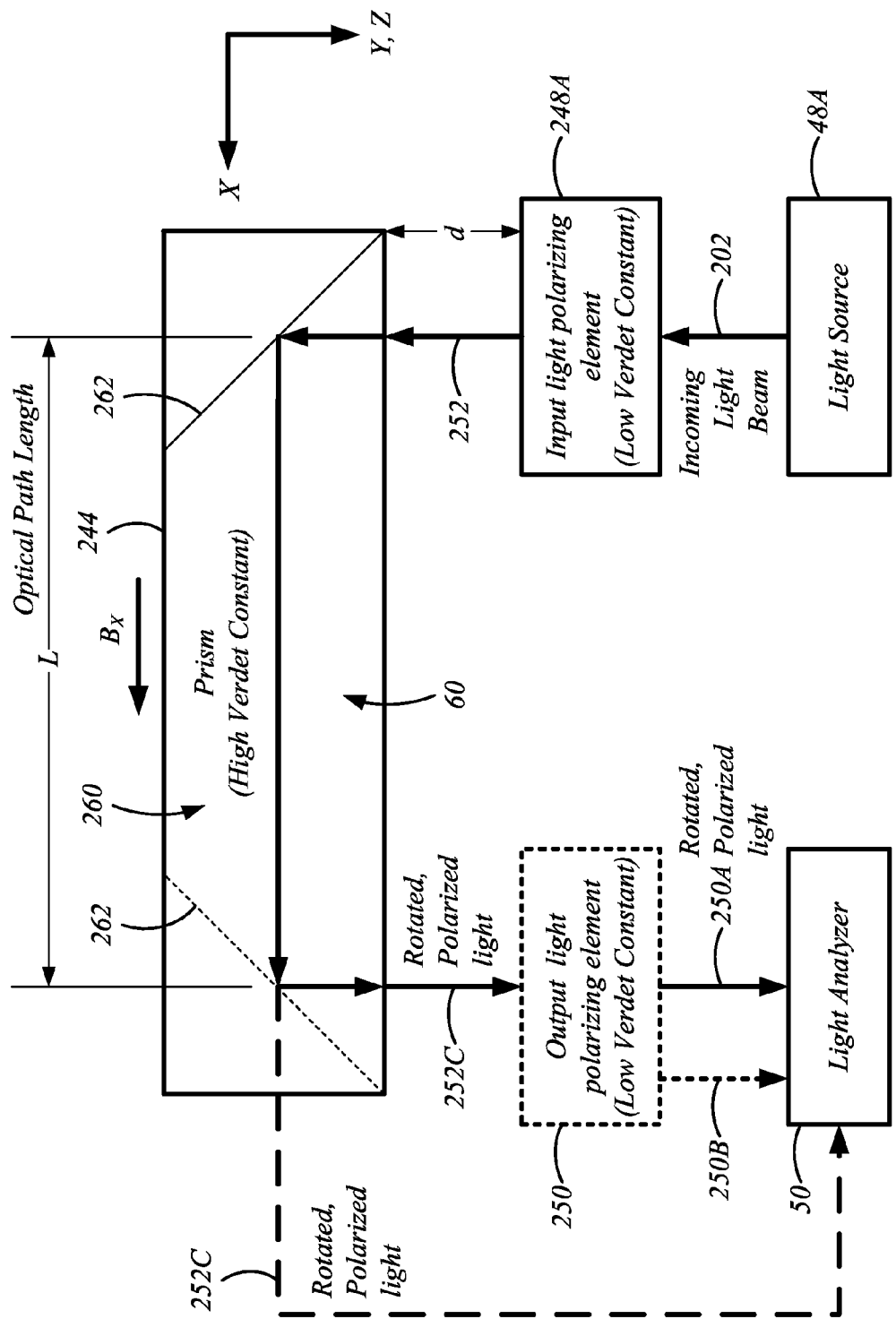
FIG. 16 is a functional block diagram of an optical sensor composed of materials having disparate Verdet constants.

FIG. 16 is a functional block diagram of an optical sensor assembly 240 for measuring a characteristic of electricity, such as current, in a current carrying cable, such as the current carrying cable 12. The optical sensor assembly 240 includes an input light polarizing element 248, which has a low Verdet constant and receives an incoming light beam 202 from the light source 48A. The input light polarizing element 248 produces a polarized light 252 at its output. The optical sensor assembly 240 further includes a prism 244 mounted to the input light polarizing element 252. The prism 244 receives the polarized light 252 and has a first reflective surface 262 positioned immediately adjacent to the input light polarizing element 248. The prism 244 has a high Verdet constant relative to the low Verdet constant of the input light polarizing element 248. The distance, d, shown in FIG. 16, between the sloped, reflective surface 262 and the input light polarizing element 248 having a low Verdet constant is as close to zero as possible so that the polarized light 252 entering the prism 244 along the y- or z-direction travels as short a distance as possible through the high Verdet constant material before traveling across the airgap 60 along the x-direction. Within this distance, the polarization angle of the polarized light 252 as it travels orthogonal to the x-direction of the magnetic field of interest $B_X$ can be undesirably influenced by magnetic fields from another nearby current carrying cable other than the current carrying cable 12 to which the optical sensor assembly 240 is coupled. Thus, it is desirable for the distance, d, to be as close to zero as possible to minimize the distance that the polarized light 252 travels in the high Verdet constant medium of the prism 244.

Advantageously, by having a low Verdet constant, the incoming light beam as it travels through the input light polarizing element 248 is relatively unaffected by unwanted magnetic fields traveling in the y-direction, orthogonal to the direction of the magnetic field of interest $B_X$, and therefore, less susceptible to such magnetic fields. In effect, by shortening all the y-axis or z-axis distances the light travels before and after spanning the airgap 60, combined with the selection of a low Verdet constant for materials that the light traverses along the y-axis or z-axis and a high Verdet constant for materials that the light traverses along the x-axis through the airgap, a current sensor having a very wide dynamic range for sensing current and very low sensitivity to unwanted magnetic fields can be achieved.

While the present disclosure is not limited to specific Verdet constants, a ratio of the high Verdet constant to the low Verdet constant can be at least 4:1 or at least 6:1. Stated differently, the low Verdet constant in an example does not exceed 4 rad/Tm or does not exceed 3 rad/Tm or does not exceed 2 rad/Tm, and the high Verdet constant is at least 12 rad/Tm or at least 22 rad/Tm or at least 36 rad/Tm or at least 40 rad/Tm. The relative terms "low" and "high" in connection with the Verdet constant of the sensor materials will be understood by those skilled in the art of electro-optical sensors. According to the Faraday effect, the angle of rotation of the polarized light is a function of the Verdet constant and the optical path length, or the physical distance that the polarized light travels through a magnetic field. The sensitivity of the material is thus related to the optical path length, so the materials are selected such that the glass prism through which the polarized light travels in the same direction as the magnetic field of interest has a relatively high Verdet constant and is thus highly sensitive to the magnetic fields. On the other hand, light traveling through other materials that are also exposed to unwanted magnetic fields is passed through a material having a relatively low Verdet constant and is thus relatively insensitive to such unwanted magnetic fields. The values and ratios provided herein are exemplary as they are related to the optical path length selected for the polarized light. The imprecise nature of language renders the terms "high" and "low" difficult to quantify any more precisely than the ordinary meaning of the words themselves allows, but persons of ordinary skill in the art to which the present disclosure pertains will understand what these terms mean. For example, a person of ordinary skill in the art would not understand that a Verdet constant of 1 rad/Tm to be a "high" Verdet constant in the context of the present disclosure.

The first reflective surface 262 changes a direction of the polarized light 252 passing through an intermediate portion 260 of the prism 244. The optical sensor assembly optionally includes an output light polarizing element 250 coupled to the prism 244. The prism 244 has a high Verdet constant relative to the Verdet constant of the optional output light polarizing element 250. An optional second sloped, reflective surface 262 can be positioned at the other side of the intermediate portion 260 to change the direction of the rotated, polarized light 252C before it leaves the prism 244. The sloped reflective surfaces 262 oppose the intermediate portion 260 such that the pair of reflective surfaces 262 and the intermediate portion 260 form a trapezium shape as shown, for example, in FIG. 21C. Otherwise, the rotated, polarized light 262C can leave the prism 244 without being reflected and provided to the light analyzer 50 as shown in FIG. 16.

An overall height of the intermediate portion 260 of the prism 244 can be equal to or no greater than a height of the trapezium. As mentioned above, as the polarized light 252 travels across the airgap 60 in the high Verdet constant medium, the angle of rotation of the polarization is changed according to the Faraday effect, producing a rotated, polarized light 252C whose angle of rotation bears a linear relationship with the electrical current flowing through the current carrying cable 12. The output light polarizing element 250 can include one or more rotated, polarized light beam outputs 250A, 250B, which are provided to the light analyzer 50.

Figure 17:
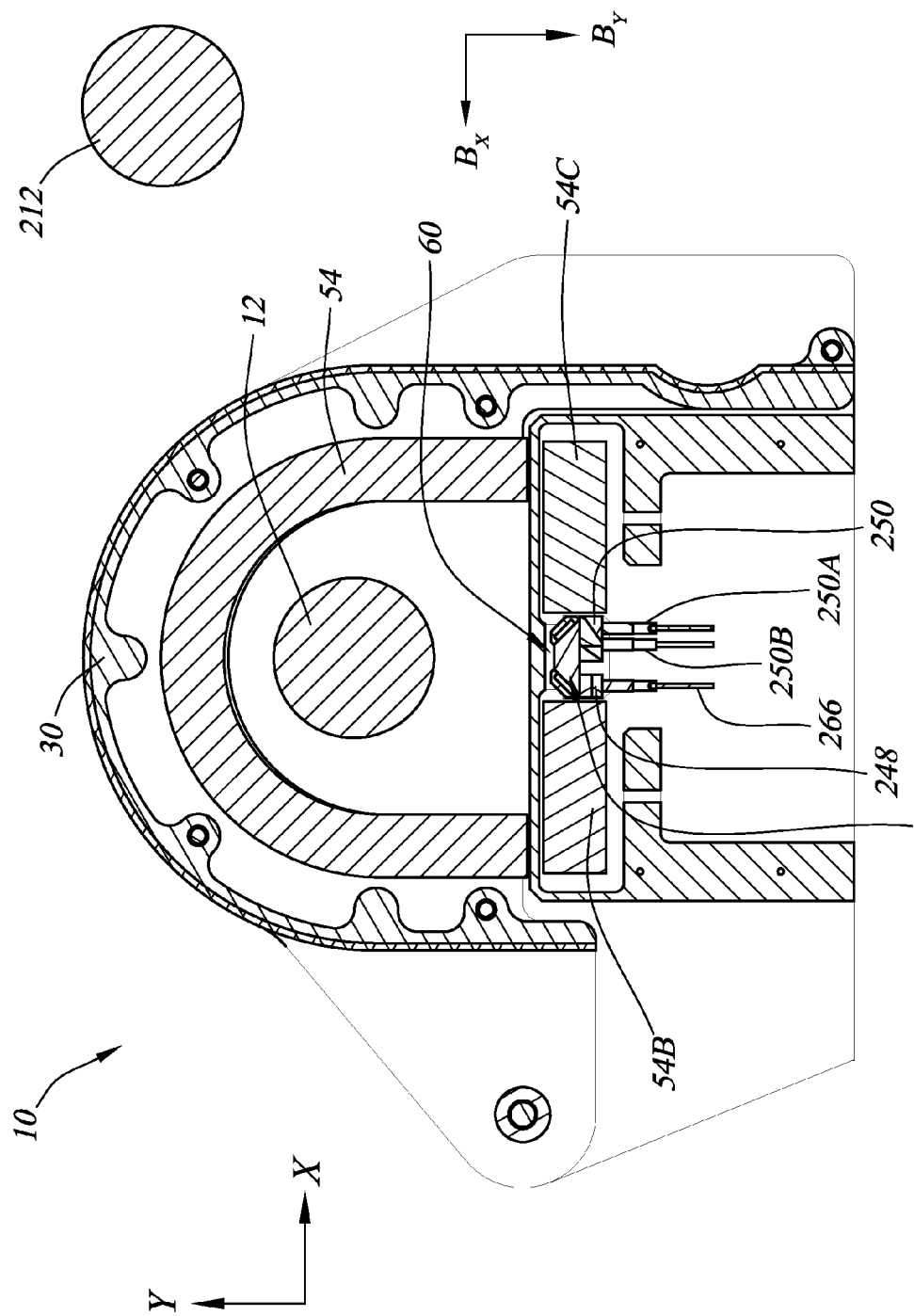
FIG. 17 is a cutaway view of an optical sensor assembly oriented such that the optical fibers extend downward along a y-direction.

FIG. 16 illustrates an aspect of many aspects pertaining to the present disclosure, whose principles, structures, functions, and other teachings apply equally or equivalently to any other sensor disclosed herein, such as any sensor 40 shown and described in connection with FIGS. 5A, 5B, and 10-15. The figures represent various exemplary implementations of the present disclosure, but they are intended to be merely illustrative of the aspect shown and described in connection with FIG. 16. Comparing FIG. 17 with FIG. 18, two different orientations of the optical sensor assembly 240 are shown. In FIG. 17, the optical sensor assembly 240 is oriented such that the incoming light beam 202 enters the prism 244 in a direction that is substantially orthogonal to a direction of the electrical current in the current carrying cable 12. In FIG. 17, the incoming light beam 202 enters the prism 244 along the y-axis direction, while the electrical current flows in the z-axis direction through the current carrying cable 12. Here, magnetic fields, particularly with a y-axis component, designed by $B_Y$ in FIG. 17, can undesirably influence the polarized light 252 as it travels through the high Verdet constant material of the prism 244 along the y-axis before it spans the airgap 60 along the x-axis parallel to the magnetic field of interest $B_X$. As described in FIG. 16, by shortening the distance between the input light polarizing element 248 and the first sloped, reflective surface 262, any $B_Y$ magnetic field components have a minimal effect on the polarized light 252 traveling along the y-axis. For convenience, the term "optical sensor" or "sensor" refers to the structures of the optical sensor assembly through which the light passes, such as the prism 244 and the input and output elements 248, 250. The term "optical sensor assembly" can include additional components or elements. The term "optical sensor" includes or encompasses the term "electro-optical sensor," which is interchangeable with the term "optical sensor."

Figure 18:
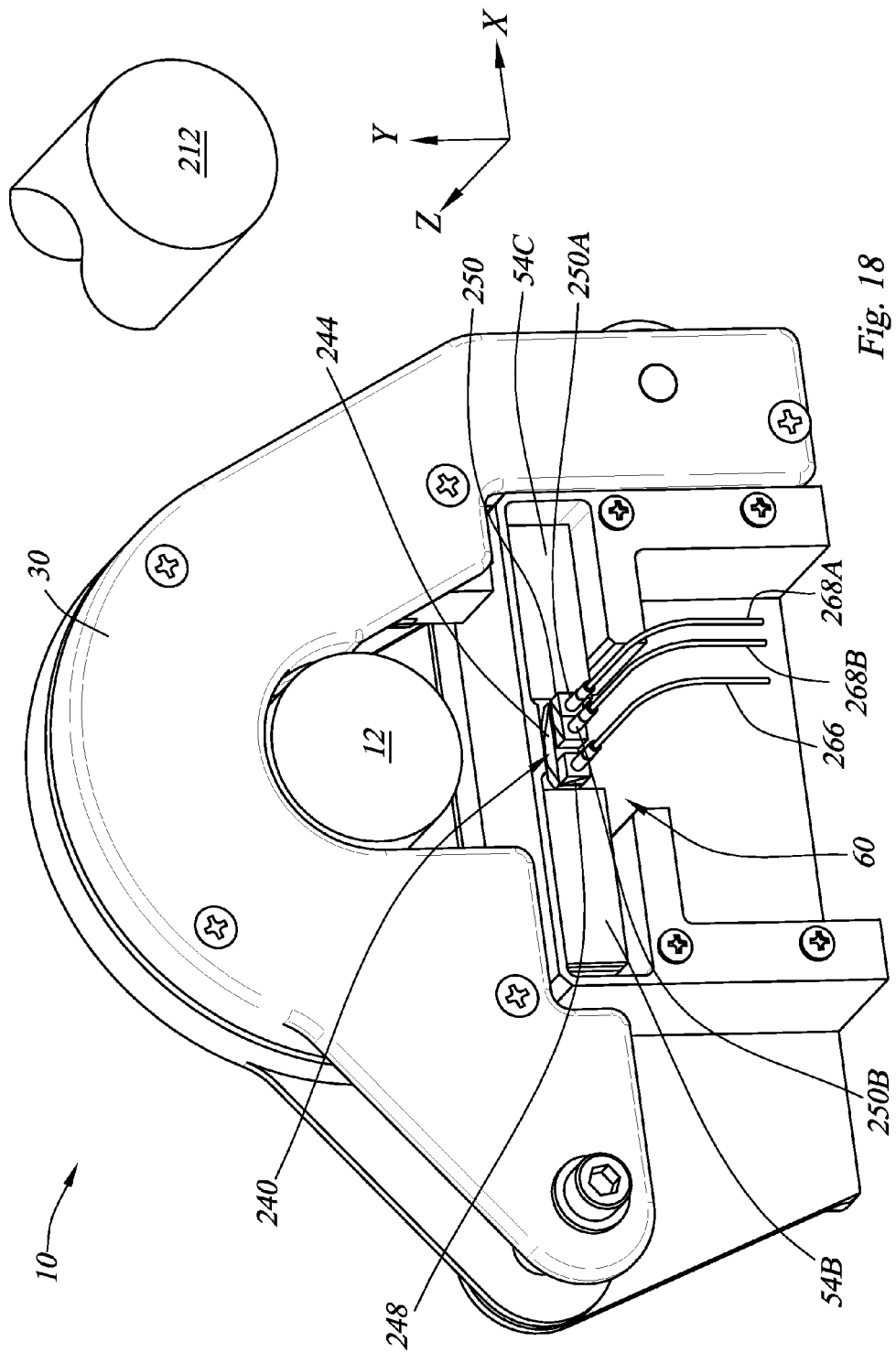
FIG. 18 is a perspective view of an optical sensor assembly oriented such that the optical fibers extend along a direction parallel to a current carrying cable.

In FIG. 18, the optical sensor assembly 240 has been rotated 90 degrees around the x-axis such that the prism 244 is disposed in the airgap 60 so that the incoming light beam 202 enters the prism 244 in a z-axis direction that is substantially parallel to the z-axis direction of the electrical current in the current carrying cable 12. Here, the z-axis depth of the housing 30 is dimensioned to accommodate the bending radius (shown as radius R in FIG. 23A) of the optical fibers 266, and 268A,B as they are bent to travel along the y-axis direction to the light analyzer 50 in implementations where it is positioned below the optical sensor assembly 240. Because the polarized light 252 enters the high Verdet constant material of the prism 244 long the z-axis direction, which is orthogonal to both the x- and y-components of unwanted magnetic fields induced by the current in the current carrying cable 12 or an adjacent cable 212, the polarized light 252 will be all but unaffected by the $B_Y$ component of unwanted magnetic fields. This implementation will be described in more detail below.

Figure 19:
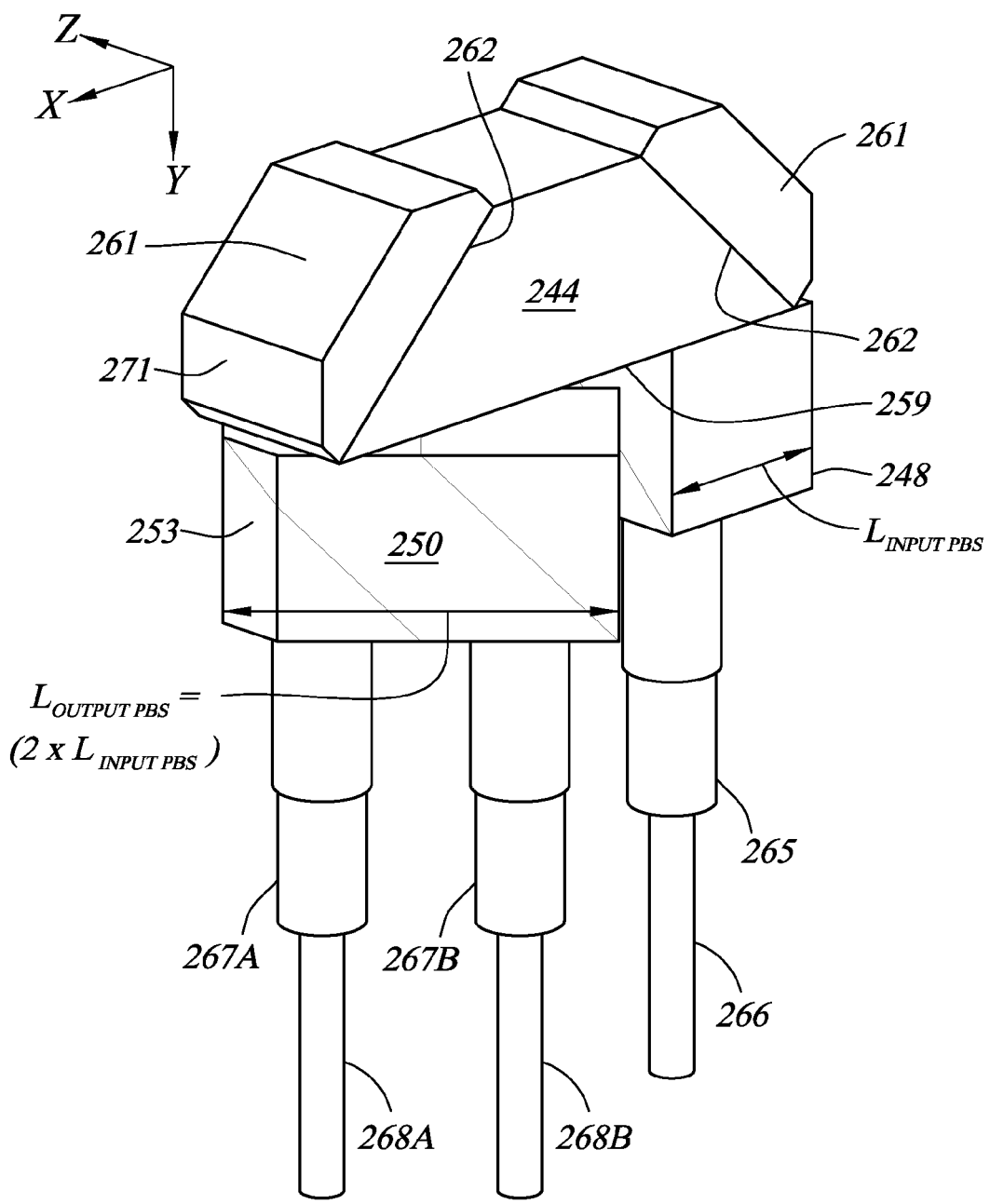
FIG. 19 is a perspective illustration of an optical sensor assembly having an output polarizing beamsplitter mounted at a 45 degree angle with respect a length of a prism from an end edge thereof.
Figure 20:
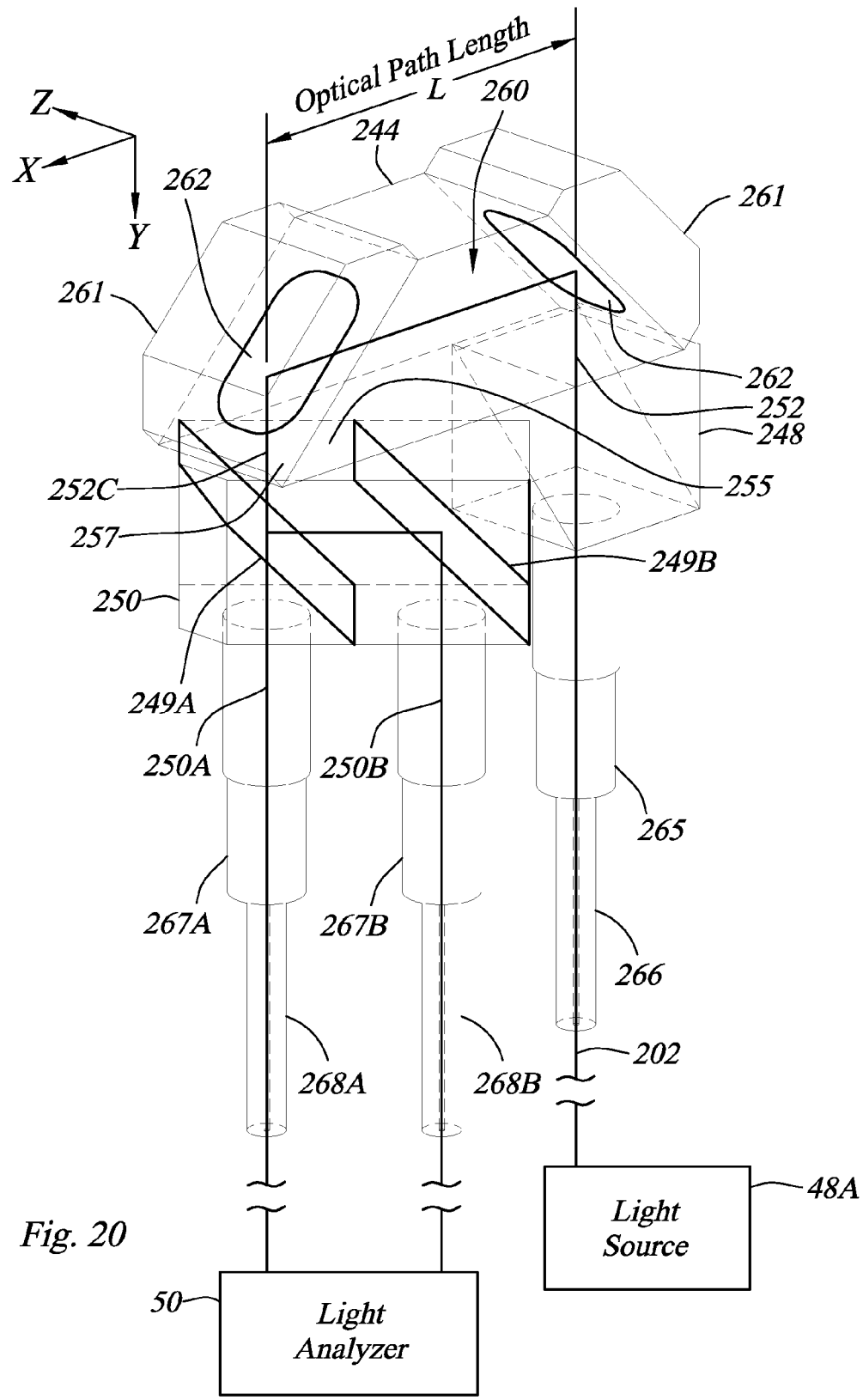
FIG. 20 is a perspective illustration of the optical sensor assembly shown in FIG. 19 with some of the surfaces hidden to reveal some internal structures and light paths inside the optical sensor.

FIG. 19 is a perspective view of an optical sensor assembly 240 in which the optical fibers 266, 268A, 268B extend downwards (relative to earth) along the y-axis away from the current carrying cable 12. FIG. 20 is the same view with the surfaces shaded to show some of the internal structures and light paths within the optical sensor assembly 240. FIGS. 21A-21D are top, first end, side, and second end views, respectively, of the optical sensor assembly 240 shown in FIGS. 19 and 20. The discussion that follows for this exemplary implementation will make reference to FIGS. 19, 20, and 21A-21D.

The prism 244 includes a pair of prism caps 261 arranged at a 45 degree angle to cover the total internal reflection (TIR) surfaces or reflective surfaces 262 that change the direction of the polarized light by 90 degrees each time it strikes the corresponding TIR or reflective surface 262 to cause double reflection of the polarized light. The prism 244 (including the prism caps 261) has an overall length, designated as $L_{SENSOR}$ in FIG. 21A. The input light polarizing element 248 is a polarizing beamsplitter (PBS) in this example, which is mounted directly to a bottom surface 259 of the prism 244. The term "bottom" herein is not intended to reflect any particular orientation of the surface relative to earth, but rather to distinguish the various surfaces of the optical sensor assembly with different terms. In this example, however, due to the orientation of the optical sensor assembly 240, it is convenient to refer to the surface 259 as a bottom surface because relative to earth, this bottom surface 259 is at the bottom of the prism 244. However, as will be discussed with reference to the orientation shown in FIG. 18 or 24, the "bottom" surface 259 is not necessarily at a bottom orientation relative to earth. The input PBS 248 is mounted to the prism 244 in such a way as to not extend the overall length, $L_{SENSOR}$, of the sensor 240. Thus, an end surface 283 (FIG. 21D) of the input PBS 248 is flush with an end surface 281 (FIG. 21D) of the prism 244, or at least the end surface 283 of the input PBS 248 does not extend beyond the end surface 281 so that the overall length of the sensor 240 is constrained by $L_{SENSOR}$.

Likewise, the output polarizing element 250 in this example is a polarizing beamsplitter (PBS), which is also mounted to a transmitted light surface 257 (FIG. 20) of the prism 244. The transmitted light surface 257 corresponds to the bottom surface 259, but the transmitted light surface 257 is an area of the bottom surface 259 out of which the rotated, polarized light exits the prism 244 and enters an outer incident light surface 255 (FIGS. 19, 20) of the output PBS 250 that opposes the outer transmitted light surface 257 of the prism 244. The output PBS 250 includes a chamfered surface 253 (FIG. 19) that is flush with an end surface 271 (FIG. 19) of the prism 244, or at least the chamfered surface 253 of the output PBS 250 does not extend beyond the end surface 271 of the prism 244 so that the overall length of the sensor 240 is constrained by $L_{SENSOR}$. In these examples, therefore, no part of the output PBS 250 and no part of the input PBS 248 extend beyond a longest dimension of the prism 244, $L_{SENSOR}$. The chamfered surface 253 is cut so as not to interfere with the beam splitting interfaces 249A,B (seen in FIG. 20) inside the output PBS 250. Alternately, the beam splitting interfaces 249A,B can be positioned within the output PBS 250 so that a sufficient amount of glass can be cut away to form the chamfered surface 253 so that it can be flush with the end surface 271.

To keep the overall length of the sensor 240 as short as possible, the output PBS 250 is rotated at a 45 degree angle from an end edge 271 of the prism 244 and extending along a length of the prism 244 (FIG. 21A). The length, $L_{SENSOR}$, is at least as long as the desired optical path length L (FIG. 20) across the airgap 60. According to the Faraday effect, the rotation angle of the polarized light is a function of the Verdet constant of the material (typically glass), the magnetic flux density, and the optical path length, L. The rotation of the output PBS 250 relative to the prism 244 is done in such a manner so as not to increase the overall length of the sensor 240.

The output PBS 250 is a rhomboid PBS that splits the rotated, polarized light 252C into two light beams, with approximately half of the optical intensity being received by the first optical collimator 267A and the other half of the optical intensity being received by the second optical collimator 267B (FIG. 19). Accordingly, the output PBS 250 has a length, $L_{OUTPUT\ PBS}$ that is twice a length of the input PBS 248, $L_{INPUT\ PBS}$ (FIG. 19). A width of the input PBS 248, $W_{INPUT\ PBS}$, is not greater than or is equal to a corresponding width of the prism, $W_{PRISM}$ (FIG. 21D). A width of the output PBS 250, $W_{OUTPUT\ PBS}$ (FIG. 21A), is not greater than or is equal to a corresponding width of the prism, $W_{PRISM}$ (FIG. 21D). The overall length of the optical sensor assembly 240, $L_{SENSOR}$ (FIG. 21A), does not exceed a length of the prism 244.

Figure 22:
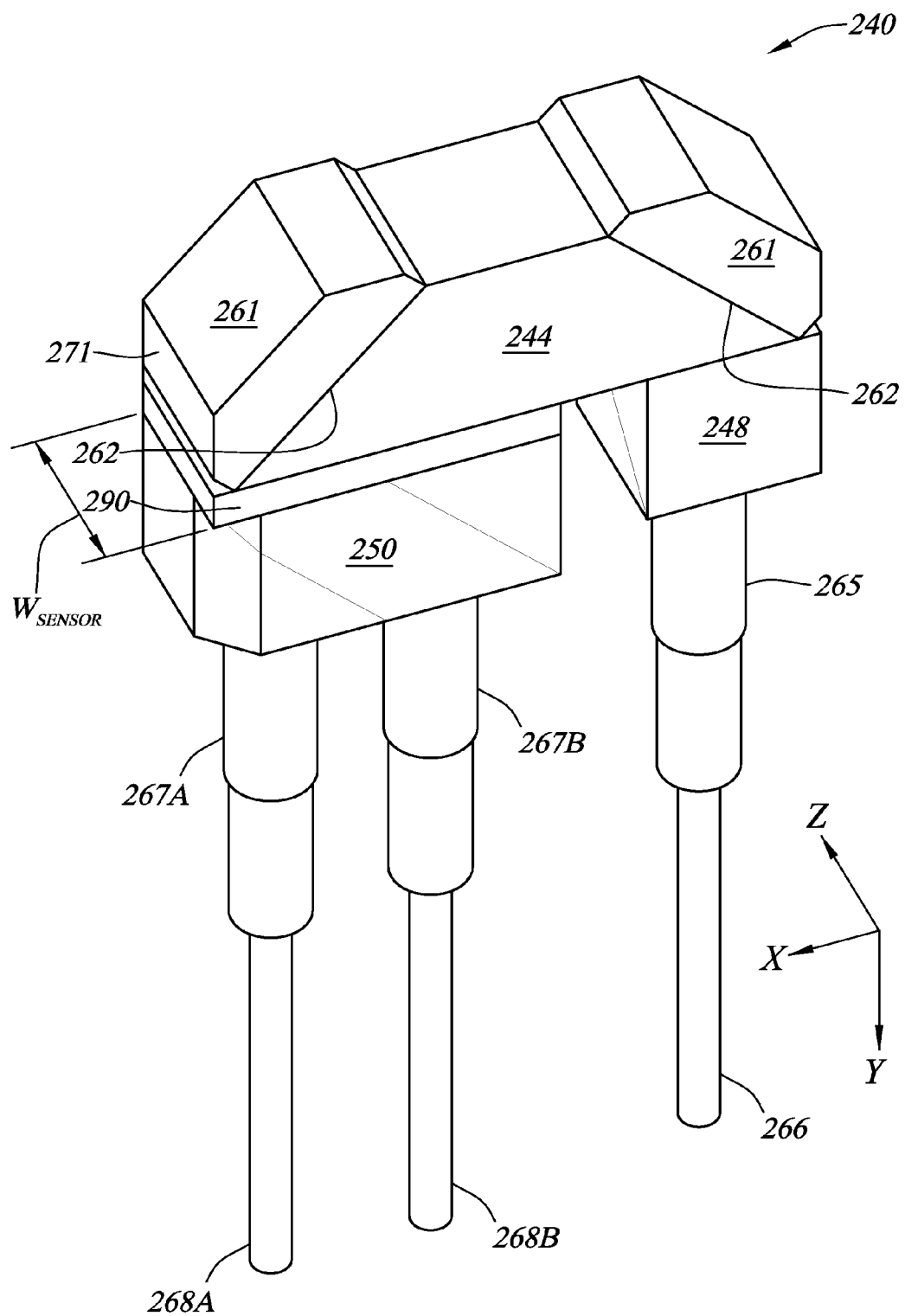
FIG. 22 is a perspective illustration of an optical sensor assembly having an output polarizing beamsplitter mounted to a half-wave plate that is mounted to the bottom of a prism.

FIG. 22 is a perspective view of a more compact (in overall volume) optical sensor assembly 240, in which a half-wave plate 290 is sandwiched between the prism 244 and the output PBS 250, and the output PBS 250 is aligned lengthwise with a length of the prism 244. In this example, the half-wave plate 290 is configured to rotate the light reflected off the reflective surface 271 by 45 degrees before presenting it to the output PBS 250, which splits the optical energy approximately in half, one going to each optical collimator 267A,B. Now, the width of the output PBS 250 is not greater than the width of the prism 244 and the half-wave plate 290 such that the overall width, $W_{SENSOR}$, of the sensor 240 when fully assembled is not increased by the output PBS 250 or the half-wave plate 290.

As discussed above, any of the optical sensor assemblies disclosed herein can be oriented along the z-axis direction such as shown in FIG. 18. In this example using the optical sensor assembly shown in FIG. 22, the optical fibers 266, 268A,B extend away along the z-axis direction. When the light analyzer 50 is positioned below the sensor assembly 240 along the y-axis, the optical fibers 266, 268A,B are bent as much as their bending radius allows. While the disclosure contemplates this orientation, in another implementation, the sensor 240 can still be inserted into the airgap 60 along the z-axis direction, while the optical fibers (and optional collimators 265, 267A,B) extend along the y-axis direction.

Figure 23A:
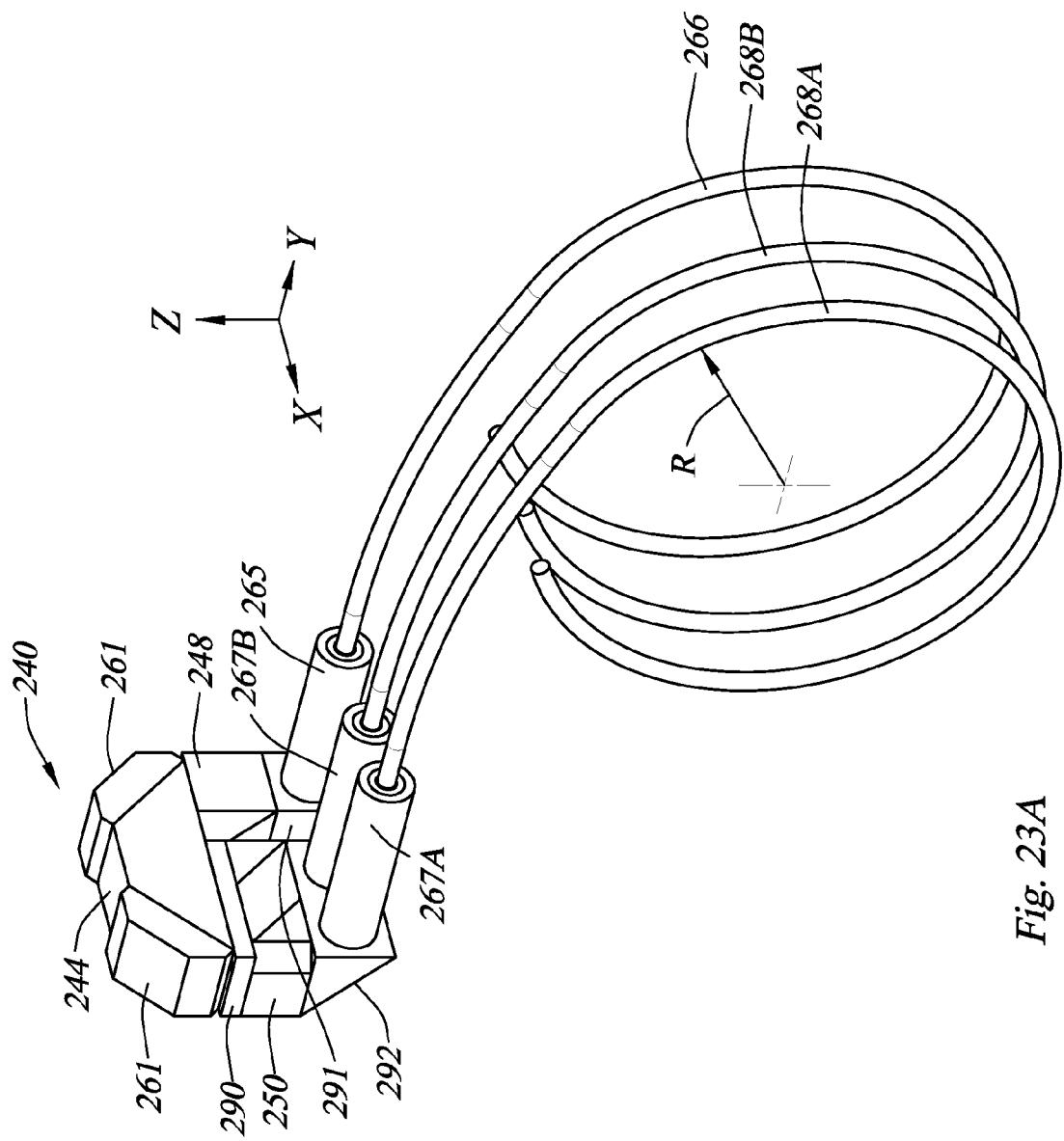
Figure 24:
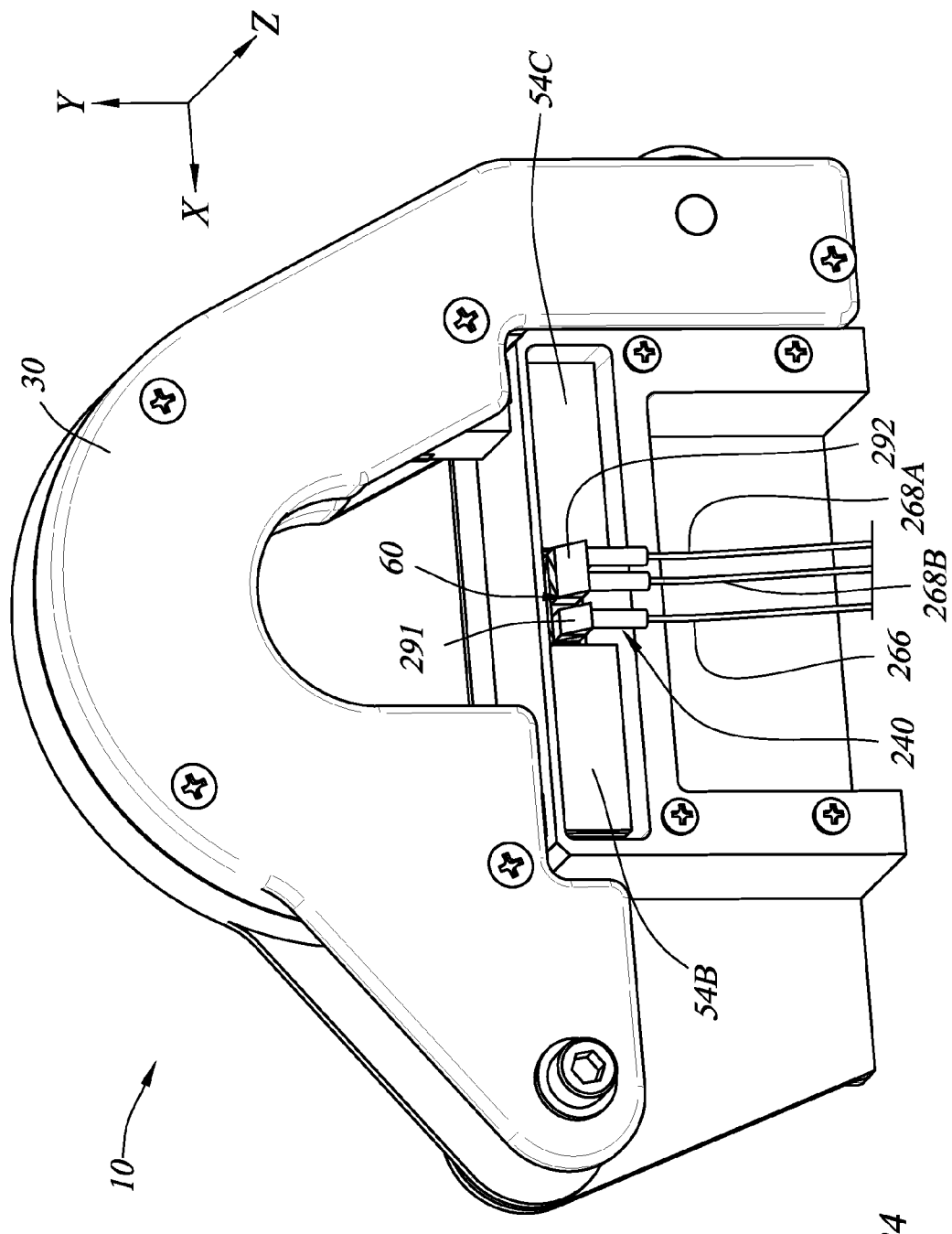
FIG. 24 is a perspective illustration of the optical sensor assembly shown in FIGS. 23A-23C installed into a mechanical structure that is clamped around a current carrying cable.

Referring to FIGS. 23A-23C, a 45-degree prism mirror 291 is mounted to the input PBS 248, and a 45-degree prism mirror 292 is mounted to the output PBS 250. The optical sensor assembly 240 shown in FIGS. 23A-23C is the same as the optical sensor assembly 240 shown in FIG. 22, except that the prism mirror 291 is mounted to the bottom surface of the input PBS 248, which changes the direction of the incoming light beam 202 entering the input PBS 248 along the y-axis by 90 degrees from the y-axis to the z-axis, and the prism mirror 292 is mounted to the bottom surface of the output PBS 250, which changes the direction of the rotated, polarized light 250A,B exiting the output PBS 250 by 90 degrees from the z-axis direction to the y-axis direction, which is shown in FIG. 24 with the sensor assembly 240 installed within the airgap 60.

Each of the optical sensors shown in FIGS. 16-24 has a very high dynamic range for sensing a wide range of current magnitudes. At the same time, the sensors are highly sensitive to a magnetic field of interest in a direction parallel to the linear polarized light traversing the airgap, but highly insensitive to unwanted or stray magnetic fields induced by nearby current carrying cables, such as carrying other phases of current. The resulting optical sensor is highly accurate, very compact in size, and can be oriented within an airgap in any orientation regardless of which axis along which the airgap lies. This flexibility allows for more degrees of freedom in designing housings for the sensors without sacrificing accuracy, sensitivity, or size. The small size of the optical sensor allows it to be placed closer to the magnetic concentrator, resulting in stronger magnetic fields that produce larger angles of rotation. As a result, smaller magnitudes of current can be detected by the optical sensor.

Thus, numerous variations exist of combination and location of light source, polarizers and beamsplitter relative to the light directing device. All are within the scope of the implementations and aspects disclosed herein.

Those skilled in the art will recognize that light directing devices may provide more than one output per device, as to the same or different characteristics. Many devices, amplifiers, filters, analog to digital converters and others may be multi-channeled and capable of handling more than one channel of information may be used, with different scaling, to enable different instruments to be operably connected to the system, or a single instrument may be connected with multiple inputs.

While illustrative examples are provided, those skilled in the art may devise alternative arrangements and components to meet the specific need for reflection. Such alternative embodiments and equivalents should be considered within the scope of the present disclosure. Equivalent methods such as the use of reflective surfaces or thin film refractive surfaces should be considered within the scope of the present disclosure.

The word "prism" is used to describe the light directing device, in some embodiments. From an inspection of FIG. 7, and FIGS. 10-24, it may be seen that the term is intended to include a variety of shapes. The simplest shape is an isosceles trapezoid, having a top and bottom parallel surfaces, the top surface sloping downwardly at both ends to the bottom parallel surface. See, for example, FIG. 13. FIGS. 10 and 12 illustrate a prism having the shape of an irregular hexagon, having top and bottom parallel surfaces, four parallel sides and two inwardly sloping upwards sides at the top. FIG. 11 is an even more irregular shape, having only one upwardly sloping side. FIGS. 14 and 15 illustrate that the light directing device may be linear in shape. All of such shapes are included within the meaning of the word "prism" herein.

As used in this application, the words "a," "an," and "one" are defined to include one or more of the referenced item unless specifically stated otherwise. Also, the terms "have," "include," "contain," and similar terms are defined to mean "comprising" unless specifically stated otherwise. Furthermore, the terminology used in the specification provided above is hereby defined to include similar and/or equivalent terms, and/or alternative embodiments that would be considered obvious to one skilled in the art given the teachings of the present patent application.

What is claimed is:

1. An optical sensor assembly for measuring electrical current in a current carrying cable, comprising:
    an input light polarizing element having a low Verdet constant and configured to receive an incoming light beam and produce a polarized light;
    a prism mounted to the input light polarizing element, the prism receiving the polarized light and having a reflective surface positioned immediately adjacent to the input light polarizing element, the reflective surface changing a direction of the polarized light passing through an intermediate portion of the prism; and
    an output light polarizing element coupled to the prism, wherein the prism has a high Verdet constant relative to the respective Verdet constants of the input light polarizing element and the output light polarizing element.

2. The optical sensor assembly of claim 1, wherein the prism has a length, and the input light polarizing element and the output light polarizing element are mounted to a transmitted light surface of the prism so as not to extend beyond the length of the prism.

3. The optical sensor assembly of claim 2, wherein no part of the output light polarizing element and no part of the input light polarizing element extend beyond a longest dimension of the prism, and wherein the output light polarizing element has a chamfered surface that is flush with an end surface of the prism.

4. The optical sensor assembly of claim 1, wherein the output light polarizing element has an outer incident light surface that opposes an outer transmitted light surface of the prism, the outer incident light surface being oriented relative to the outer transmitted light surface at an angle substantially equal to 45 degrees from an end edge of the prism and extending along a length of the prism.

5. The optical sensor assembly of claim 1, wherein a ratio of the high Verdet constant to the low Verdet constant is at least 4:1.

6. The optical sensor assembly of claim 1, wherein the low Verdet constant does not exceed 4 rad/Tm.

7. The optical sensor assembly of claim 1, wherein the high Verdet constant is at least 12 rad/Tm.

8. The optical sensor assembly of claim 1, wherein the output light polarizing element has a length that is twice a length of the input polarizing light element.

9. The optical sensor assembly of claim 1, wherein a width of the input light polarizing element is not greater than a corresponding width of the prism, and a width of the output light polarizing element is not greater than the width of the prism, and wherein an overall length of the optical sensor assembly does not exceed a length of the prism.

10. The optical sensor assembly of claim 1, further comprising a half-wave plate mounted to an outer transmitted light surface of the prism to receive transmitted light from the prism, wherein the output light polarizing element is mounted to the half-wave plate.

11. The optical sensor assembly of claim 10, wherein a width of the input light polarizing element is not greater than a corresponding width of the prism, a width of the half-wave plate is not greater than the width of the prism, and a width of the output polarizing beamsplitter is not greater than the width of the prism, and wherein an optical current sensor including the prism, the input light polarizing element, the half-wave plate, and the output polarizing beamsplitter has an overall length that does not exceed a length of the prism.

12. The optical sensor assembly of claim 1, wherein the prism is configured to expose the polarized light, while being transmitted therethrough, to a magnetic field that causes rotation of the polarization of the polarized light in accordance with the magnetic field induced by the electrical current in the current carrying cable such that the prism provides the rotated, polarized light that is indicative of the current in the current carrying cable to the output light polarizing element.

13. The optical sensor assembly of claim 12, further comprising:
   a base unit adapted to be hung from the current carrying cable; and
   a magnetic concentrator having an airgap and mounted such that the magnetic concentrator at least partially surrounds the current carrying cable such that a magnetic field in the airgap is induced which is indicative of the current in the current carrying cable, wherein the prism is disposed in the airgap.

14. The optical sensor assembly of claim 13, wherein the prism is disposed in the airgap such that the incoming light beam enters the prism in a direction that is substantially orthogonal to a direction of the electrical current in the current carrying cable.

15. The optical sensor assembly of claim 13, wherein the prism is disposed in the airgap such that the incoming light beam enters the prism in a direction that is substantially parallel to a direction of the electrical current in the current carrying cable.

16. The optical sensor assembly of claim 1, wherein the output polarizing beamsplitter provides two orthogonal outputs of rotated, polarized light when the prism is exposed to a magnetic field induced by the current in the current carrying cable, the optical sensor assembly further comprising one or more light detectors for converting the corresponding two outputs of the rotated, polarized light into corresponding electrical signals, and one or more optical collimators coupled to the output light polarizing element and configured to receive respective ones of the two outputs of rotated, polarized light.

17. The optical sensor assembly of claim 1, wherein the reflective surface is a pair of sloped reflective surfaces each opposing the intermediate portion such that the pair of reflective surfaces and the intermediate portion form a trapezium, wherein an overall height of the intermediate portion of the prism is no greater than a height of the trapezium.

18. The optical sensor assembly of claim 1, wherein the output light polarizing element is a polarizing beamsplitter.

19. An optical sensor assembly for measuring electrical current in a current carrying cable, comprising:
   an input light polarizing element having a low Verdet constant and configured to receive an incoming light beam and produce a polarized light;
   a prism mounted to the input light polarizing element, the prism receiving the polarized light and having a pair of opposing reflective surfaces flanking an intermediate portion, a first of the reflective surfaces being positioned immediately adjacent to the input light polarizing element, the reflective surfaces changing a direction of the polarized light passing through an intermediate portion of the prism; and
   an output polarizing beamsplitter mounted to the prism and rotated at a 45 degree angle relative to the prism, wherein the prism has a high Verdet constant relative to the respective Verdet constants of the input light polarizing element and the output light polarizing element.

\* \* \* \* \*